(12) United States Patent
Kao

(10) Patent No.: US 12,538,826 B2
(45) Date of Patent: Jan. 27, 2026

(54) SEMICONDUCTOR DEVICE AND METHOD OF MANUFACTURING THE SAME

(71) Applicant: TAIWAN SEMICONDUCTOR MANUFACTURING COMPANY, LTD., Hsinchu (TW)

(72) Inventor: Ching-Hung Kao, Tainan (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 59 days.

(21) Appl. No.: 17/587,605

(22) Filed: Jan. 28, 2022

(65) Prior Publication Data
US 2023/0021655 A1 Jan. 26, 2023

Related U.S. Application Data

(60) Provisional application No. 63/224,836, filed on Jul. 22, 2021.

(51) Int. Cl.
*H01L 23/00* (2006.01)
(52) U.S. Cl.
CPC .............. *H01L 24/03* (2013.01); *H01L 24/05* (2013.01); *H01L 2224/0345* (2013.01);
(Continued)
(58) Field of Classification Search
CPC ..... H01L 2224/022–02215; H01L 2224/0391; H01L 2224/03916; H01L 2224/0348;
(Continued)

(56) References Cited

U.S. PATENT DOCUMENTS 8,473,072 B2 * 6/2013 Axelgaard ........... A61N 1/0456
600/372
11,081,459 B2 8/2021 Ku et al.
(Continued)

FOREIGN PATENT DOCUMENTS

CN 101755334 A * 6/2010 ....... H01L 43/49816
KR 20080031656 A 4/2008
(Continued)

*Primary Examiner* — Jessica S Manno
*Assistant Examiner* — Eric Manuel Mulero Flores
(74) *Attorney, Agent, or Firm* — STUDEBAKER BRACKETT PLLC

(57) ABSTRACT

In a method of manufacturing a semiconductor device first conductive layers are formed over a substrate. A first photoresist layer is formed over the first conductive layers. The first conductive layers are etched by using the first photoresist layer as an etching mask, to form an island pattern of the first conductive layers separated from a bus bar pattern of the first conductive layers by a ring shape groove. A connection pattern is formed to connect the island pattern and the bus bar pattern. A second photoresist layer is formed over the first conductive layers and the connection pattern. The second photoresist layer includes an opening over the island pattern. Second conductive layers are formed on the island pattern in the opening. The second photoresist layer is removed, and the connection pattern is removed, thereby forming a bump structure.

20 Claims, 16 Drawing Sheets

(52) U.S. Cl.
CPC ............... *H01L 2224/03452* (2013.01); *H01L 2224/0346* (2013.01); *H01L 2224/03622* (2013.01); *H01L 2224/05017* (2013.01); *H01L 2224/05025* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05184* (2013.01)

(58) Field of Classification Search
CPC ............ H01L 2224/035–03554; H01L 2224/036–03632; H01L 2224/023–024; H01L 2224/031–03334; H01L 2224/03618–03632; H01L 2224/039–03916; H01L 2224/13009–13084; H01L 21/768–76898; H01L 23/522–53295; H01L 2221/10–1094; H01L 21/74–743; H01L 23/481; H01L 23/49838–49844; H01L 23/49541–49565; H01L 23/528; H01L 23/49582; H01L 23/49866–49888; H01L 21/76838–76895; H01L 24/02–09; H01L 2224/02–09519; H01L 2221/1015–1036; H01L 2224/05009; H01L 2224/05025; H01L 2224/05087; H01L 2224/0509; H01L 2224/0557; H01L 2224/08146; H01L 2224/00–98; H01L 24/00–98; H01L 21/76802; H01L 21/76804; H01L 21/76807; H01L 2224/12–14519; H01L 2224/5226; H01L 2224/528; H01L 2224/5283

See application file for complete search history.

(56) References Cited

U.S. PATENT DOCUMENTS

| | | | |
|---|---|---|---|
| 11,211,318 B2 | 12/2021 | Li et al. | |
| 2002/0084312 A1* | 7/2002 | Shier | H01L 24/03 228/180.1 |
| 2005/0106885 A1* | 5/2005 | Albertson | H01L 21/76801 257/E21.576 |
| 2008/0083560 A1 | 4/2008 | Saiki et al. | |
| 2011/0089560 A1* | 4/2011 | Kuo | H05K 1/111 257/737 |
| 2011/0133311 A1* | 6/2011 | Watanabe | H01L 21/76808 257/532 |
| 2014/0312493 A1 | 10/2014 | Suzuki | |
| 2015/0214170 A1 | 7/2015 | Chen et al. | |
| 2018/0166406 A1* | 6/2018 | Shih | H01L 21/76837 |
| 2019/0295974 A1* | 9/2019 | Muraoka | G02F 1/1345 |
| 2020/0029431 A1* | 1/2020 | Hayashi | H05K 1/116 |
| 2021/0296284 A1* | 9/2021 | Sharangpani | H01L 24/80 |

FOREIGN PATENT DOCUMENTS

| | | |
|---|---|---|
| TW | 201507084 A | 2/2015 |
| TW | 201944504 A | 11/2019 |
| TW | 202027181 A | 7/2020 |

* cited by examiner

| SIN20K | OVL shift (um) | | | | | | |
|---|---|---|---|---|---|---|---|
| PRL (um) | 0 | 0.4 | 0.6 | 0.8 | 1 | 1.2 |
| 20 | 0.0% | 0.0% | 0.0% | 0.0% | 0.0% | 0.0% |
| 50 | 0.0% | 0.0% | 0.0% | 0.0% | 0.0% | 0.0% |
| 75 | 0.0% | 0.0% | 0.0% | 0.0% | 0.0% | 0.0% |
| 100 | 0.0% | 0.0% | 0.0% | 0.0% | 0.0% | 0.0% |
| 200 | >0% | 0.0% | 0.0% | 0.0% | 0.0% | 0.0% |
| 400 | 0.0% | >0% | >0% | 0.0% | 0.0% | 0.0% |
| 500 | >0% | 0.0% | >0% | 0.0% | 0.0% | 0.0% |
| 600 | | | | | | |

FIG. 20

SEMICONDUCTOR DEVICE AND METHOD OF MANUFACTURING THE SAME

RELATED APPLICATIONS

This application claims priority to U.S. Provisional Patent Application No. 63/224,836 filed Jul. 22, 2021, the entire contents of which are incorporated herein by reference.

BACKGROUND

As consumer devices with ever better performance have gotten smaller and smaller in response to consumer demand, the individual components of these devices have necessarily decreased in size as well. Semiconductor devices, which make up major components of consumer devices such as mobile phones, computer tablets, and the like, have become smaller and smaller. The decrease in size of semiconductor devices has been met with advancements in semiconductor manufacturing techniques such as forming connections between a semiconductor device and another electronic device or a circuit board.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 20 shows advantageous effects of the embodiments of the present disclosure.

DETAILED DESCRIPTION

Figure 1:
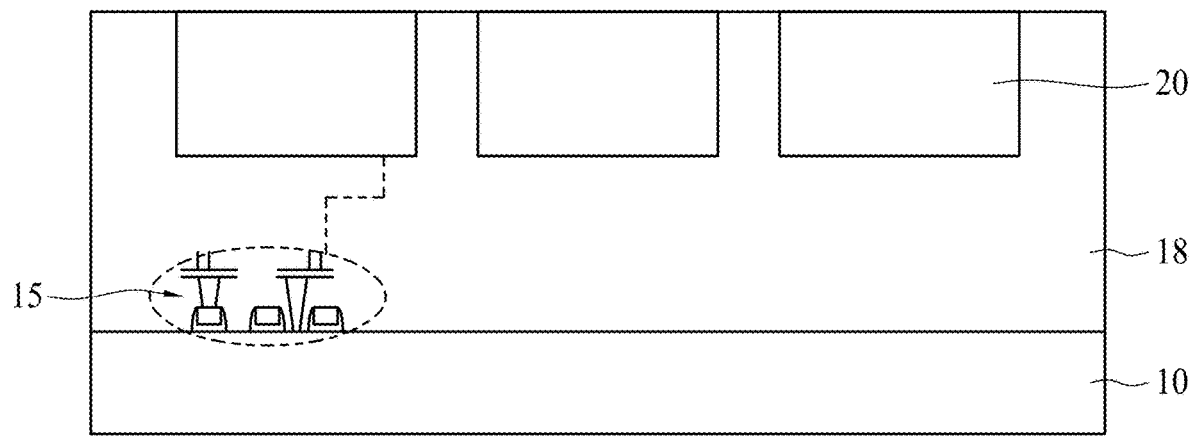
FIG. 1 shows one of the stages of a sequential manufacturing operation of a semiconductor device according to an embodiment of the present disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" The numerical values, ranges, dimensions, material, processes, configurations and/or arrangements described below are mere examples and not limited to those disclosed, and other values, ranges, dimensions, material, processes, configurations and/or arrangements may be within the scope of the present disclosure, unless otherwise explained.

As the electronic industry develops three-dimensional integrated circuits (3D IC) based on through-Si-vias (TSV) technology, the processing and reliability of topmost electrodes, such as pad electrodes or bumps on pad electrodes, which are used to interconnect the stacked chips, is being actively investigated. The pad electrodes are covered by one or more passivation insulating films to protect the semiconductor devices formed below the pad electrodes. Reliability of the passivation layers is also an important factor in manufacturing semiconductor devices. In some embodiments, a bump electrode is formed on the pad electrode, and in other embodiments, a bonding wire is directly attached to the pad electrode.

In the present disclosure, a novel technology to form pad electrodes and a passivation layer that can improve reliability of semiconductor devices is provided.

FIGS. 1-7 show various views of a sequential manufacturing operation of a bump structure over a semiconductor circuit according to an embodiment of the present disclosure. It is understood that additional operations can be provided before, during, and after processes shown by FIGS. 1-7, and some of the operations described below can be replaced or eliminated, for additional embodiments of the method. The order of the operations/processes may be interchangeable.

As shown in FIG. 1, a plurality of topmost wiring patterns 20, on which bump electrodes are to be formed, are formed in an interlayer dielectric (ILD) or intermetal dielectric (IMD) layers 18 formed over a semiconductor circuit 15 that is formed on a substrate 10. The topmost wiring patterns 20 are formed of a suitable conductive metal, including aluminum, copper, silver, gold, nickel, tungsten, titanium, alloys thereof, and/or multilayers thereof. In some embodiments, the topmost wiring patterns 20 are made of Cu or a Cu alloy in which a majority (more than 50%) is Cu. The topmost wiring patterns 20 are formed by a suitable metal deposition operation, including electro or electroless plating, physical vapor deposition (PVD) including sputtering, chemical vapor deposition (CVD), atomic layer deposition (ALD), thermal evaporation, or electron beam evaporation. In some embodiments, the topmost wiring patterns 20 are formed by using a damascene technology.

In some embodiments, the semiconductor circuit 15 includes transistors (e.g., field effect transistors (FETs)), capacitors, inductors, resistors, or the like in some embodiments. The topmost wiring patterns 20 are electrically coupled to the semiconductor circuit 15 through underlying interconnection layers including wiring layers and vias formed in dielectric layers, such as ILD layers or IMD layers in some embodiments. The wiring layers and vias of the interconnection layer may be formed of copper or copper alloys (e.g., AlCu), aluminum, tungsten, nickel, or any other suitable metal. The wiring layers and vias may be formed using damascene processes.

In some embodiments, the substrate 10 is formed of at least one selected from the group consisting of silicon, diamond, germanium, SiGe, SiGeSn, SiGeC, GeSn, SiSn, GaAs, InGaAs, InAs, InP, InSb, GaAsP, GaInP, and SiC. In some embodiments, the semiconductor substrate 10 is a silicon wafer or substrate. In some embodiments, the ILD or IMD layer 18 include one or more of silicon oxide, silicon nitride, SiOC, SiON, SiOCN, SiCN, low-k dielectric material or any other suitable dielectric materials.

Figure 2:
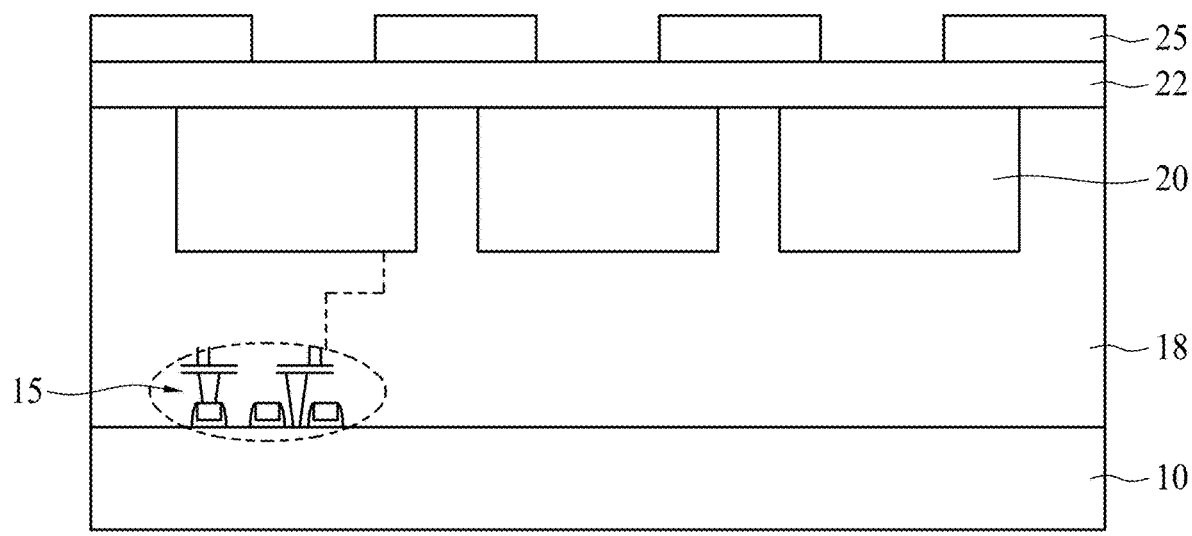
FIG. 2 shows one of the stages of a sequential manufacturing operation of a semiconductor device according to an embodiment of the present disclosure.

In some embodiments, as shown in FIG. 2 one or more top dielectric layers 22 are formed over the topmost wiring patterns 20. The top dielectric layer 22 includes one or more layers of silicon oxide, silicon nitride, SiON, SiC, SiOCN, SiCN or any other suitable insulating layers. In some embodiments, a thickness of the top dielectric layer 22 is in a range from about 0.1 µm to about 2.0 µm, and is in a range from about 0.2 µm to about 1.0 µm. The top dielectric layer 22 is formed by a suitable metal deposition operation, including PVD, CVD or ALD.

Figure 3:
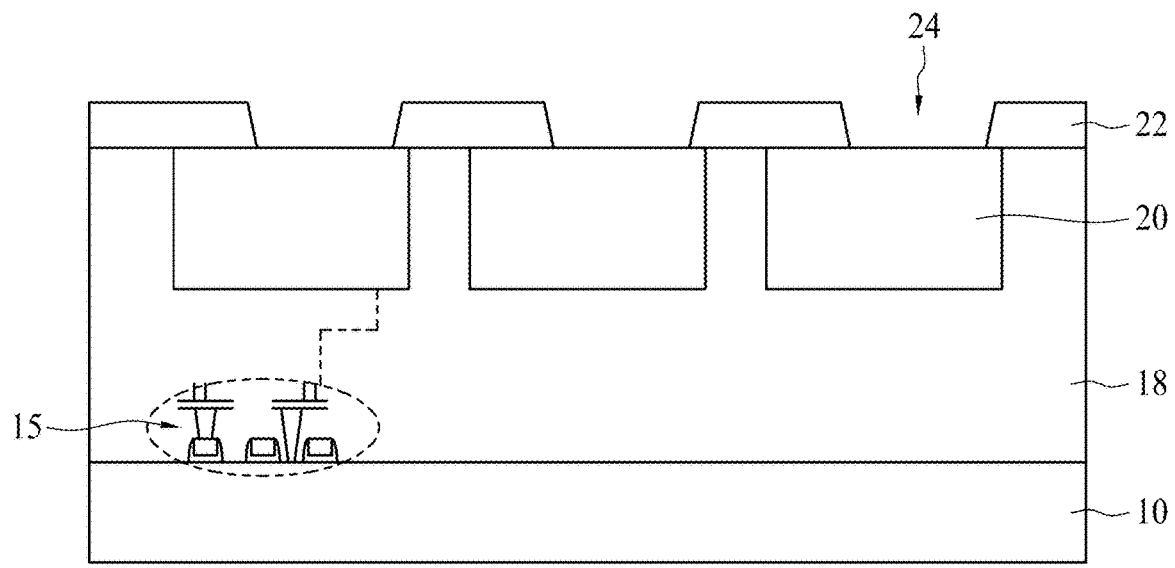
FIG. 3 shows one of the stages of a sequential manufacturing operation of a semiconductor device according to an embodiment of the present disclosure.

The top dielectric layer 22 is patterned using suitable photolithography and etching operations to form openings 24. As shown in FIG. 2, a resist pattern 25 having openings is formed on the top dielectric layer 22, and the top dielectric layer 22 is patterned by one or more etching operation. As shown in FIG. 3, part of the topmost wiring patterns 20 is exposed by the etching. In some embodiments, the opening 24 has a tapered shape as shown in FIG. 3.

Figure 4:
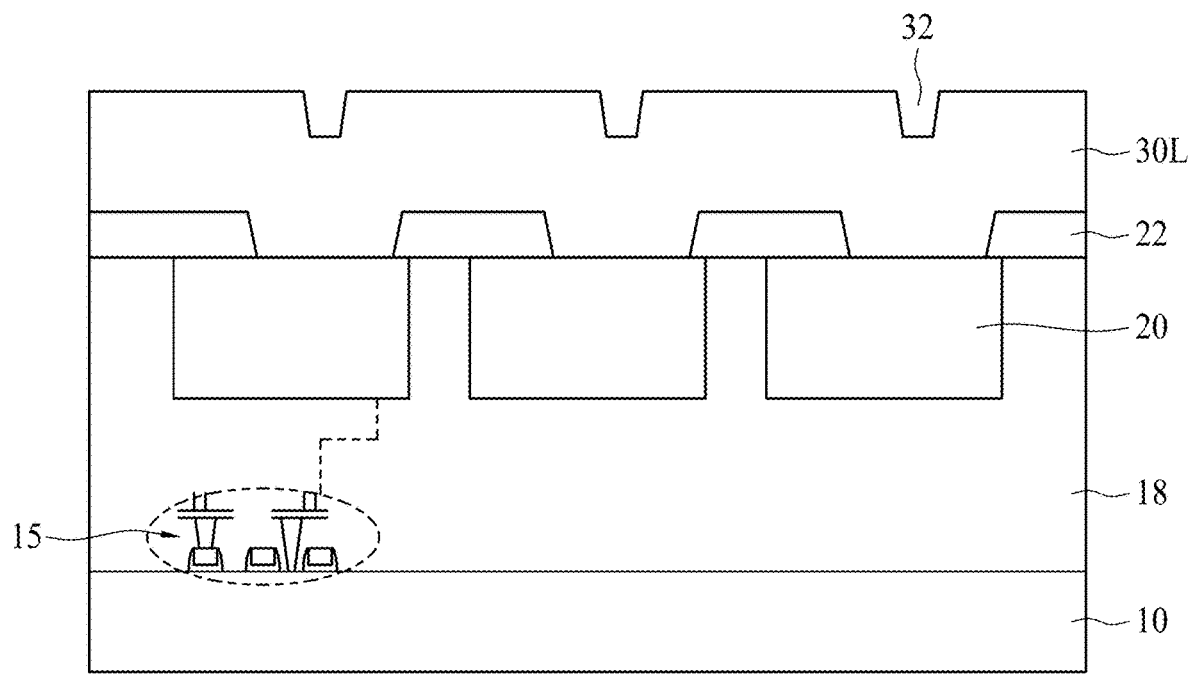
FIG. 4 shows one of the stages of a sequential manufacturing operation of a semiconductor device according to an embodiment of the present disclosure.

Then, as shown in FIG. 4, one or more conductive layers 30L are formed as a blanket layer over the top conductive layer 22 and the exposed topmost wiring patterns 20. In some embodiments, the blanket conductive layer 30L is formed by a suitable metal deposition operation, including plating, PVD (including sputtering), CVD, ALD, thermal evaporation, and electron beam evaporation. In some embodiments, the blanket conductive layer 30L includes a suitable conductive metal, including aluminum, copper, silver, gold, nickel, tungsten, titanium, alloys thereof, and/or multilayers thereof. In some embodiments, the blanket conductive layer 30L is made of Al or an Al alloy in which a majority (more than 50%) is Al. In some embodiments, a thickness of the blanket conductive layer 30L over the top dielectric layer 22 is in a range from about 0.5 µm to about 5.0 µm and is in a range from about 1.0 µm to about 3.0 µm in other embodiments. In some embodiments, as shown in FIG. 4, a recess or a dimple 32 is formed above the opening 24 reflecting the shape of the top dielectric layer 22. The recess or dimple 32 has a V-shape, a U-shape or a reverse trapezoidal shape in some embodiments. A depth of the recess or dimple 32 is in a range from about 0.05 µm to about 0.5 µm in some embodiments, and is in a range from about 0.1 µm to about 0.4 µm in other embodiments.

In some embodiments, one or more barrier layer is formed before the blanket layer 30L is formed. In some embodiments, the barrier layer includes Ti, TiN, Ta, TaN or TiW.

Figure 5:
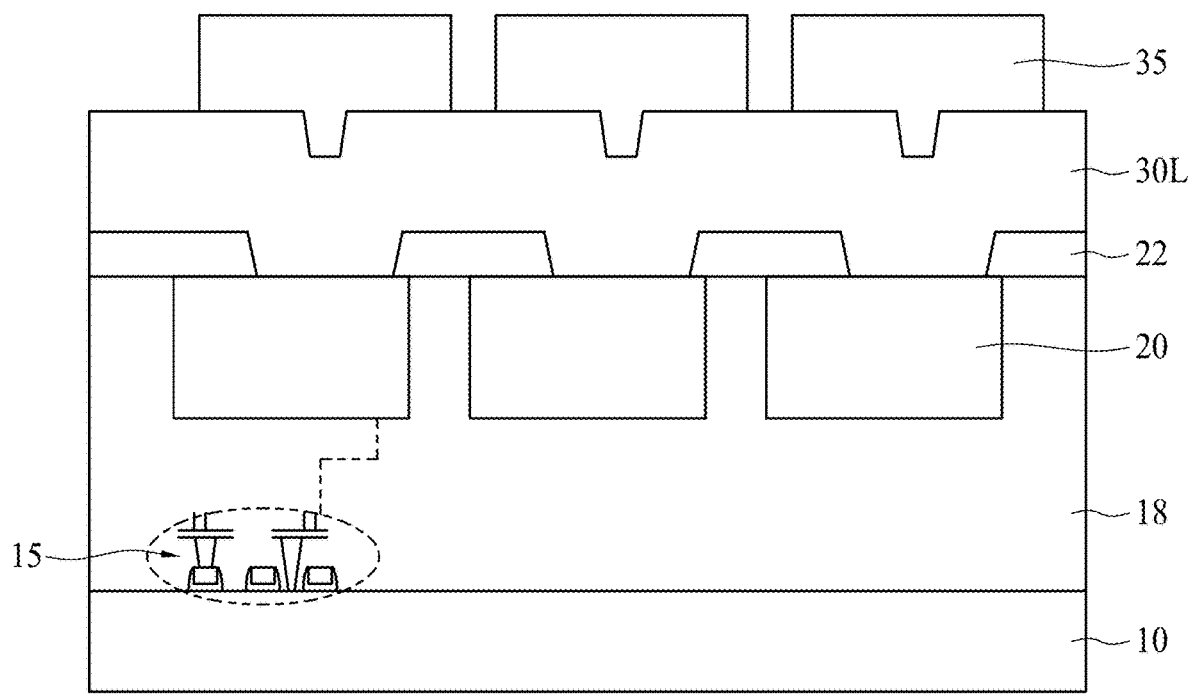
FIG. 5 shows one of the stages of a sequential manufacturing operation of a semiconductor device according to an embodiment of the present disclosure.
Figure 6A:
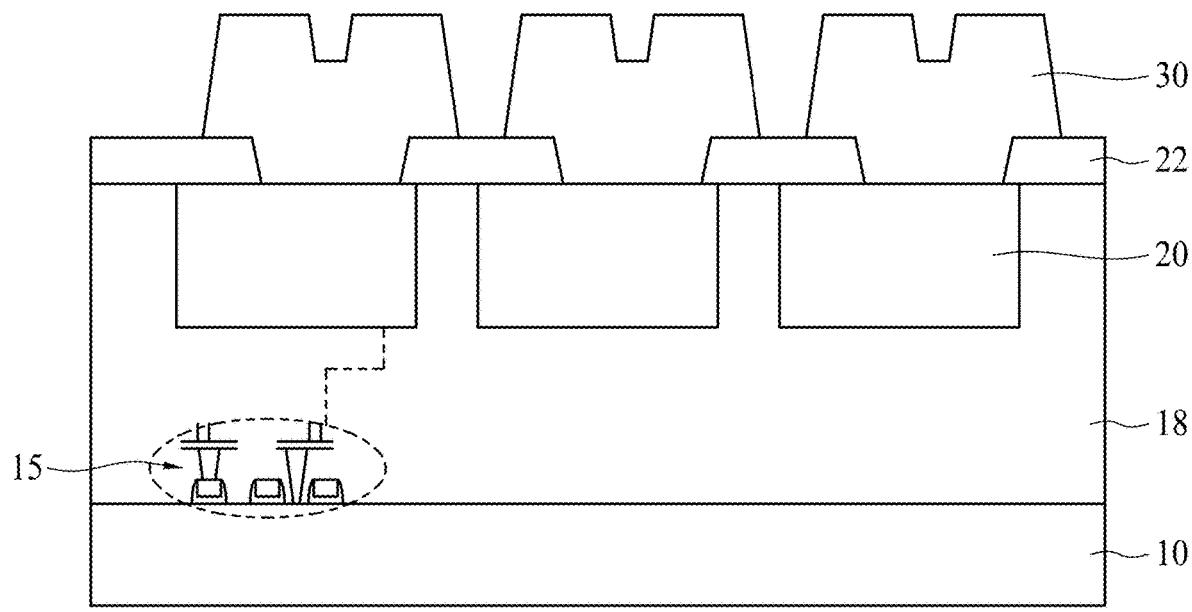
FIGS. 6A and 6B show one of the stages of a sequential manufacturing operation of a semiconductor device according to an embodiment of the present disclosure.
Figure 6B:
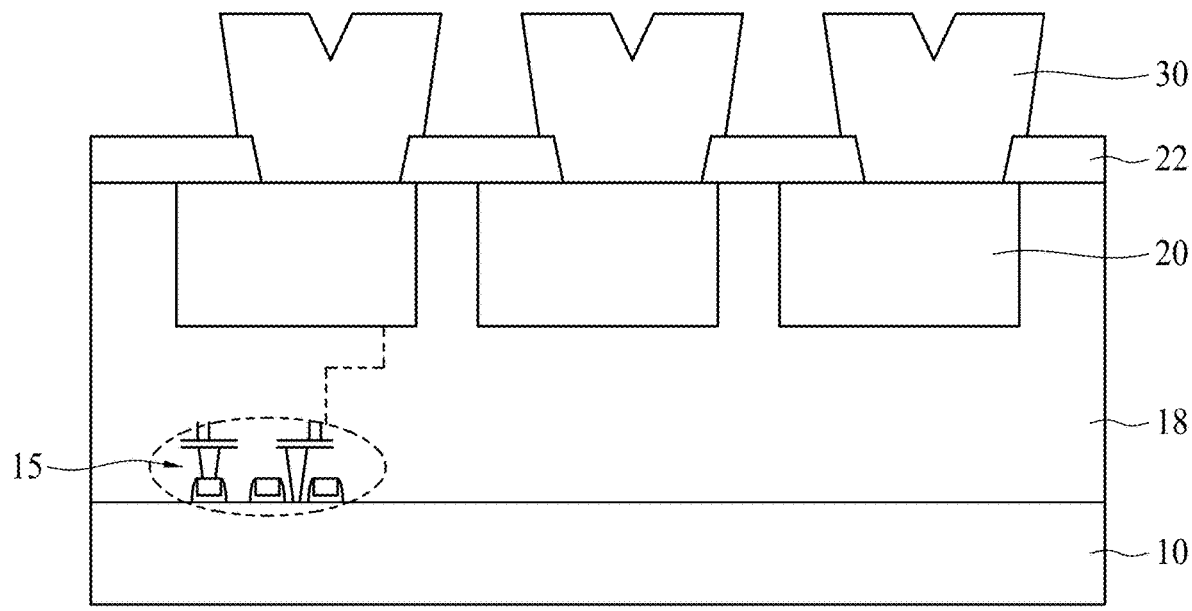

Further, as shown in FIG. 5, a resist pattern 35 is formed over the blanket conductive layer 30L, and the blanket conductive layer 30L is patterned into pad electrodes 30 by using one or more etching operations. In some embodiments, as shown in FIG. 6A, the pad electrode 30 has a tapered shape having a taper angle with respect to the normal direction towards an upper surface of the topmost wiring patterns 20 in a range from about 5 degrees to about 15 degrees. In other embodiments, as shown in FIG. 6B, the pad electrode 30 has a reverse tapered shape having a taper angle with respect to the normal direction in a range from about −5 degrees to about −15 degrees.

Figure 7:
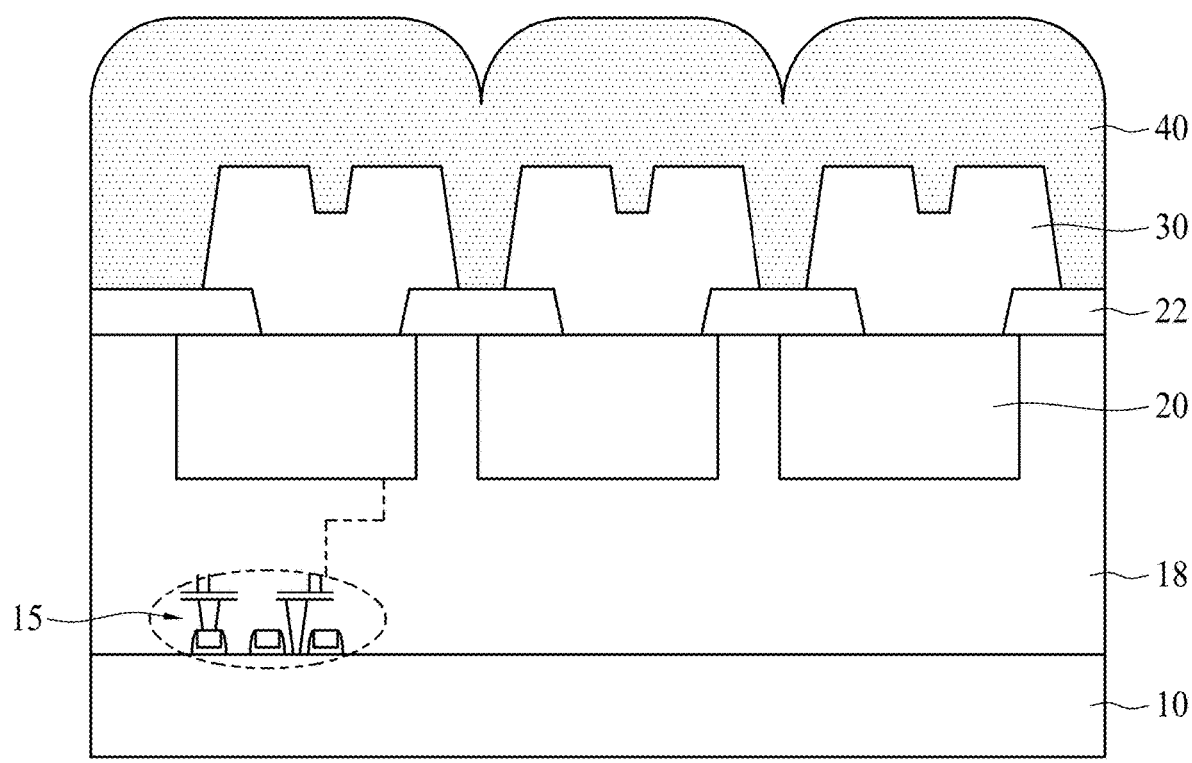
FIG. 7 shows one of the stages of a sequential manufacturing operation of a semiconductor device according to an embodiment of the present disclosure.

Next, as shown in FIG. 7, a passivation layer 40 is formed over the pad electrodes 30 and the top dielectric layer 22. In some embodiments, the passivation layer 40 includes one or more layers of silicon oxide, silicon nitride, SiOC, SiON, SiOCN, SiCN or any other suitable dielectric materials. In some embodiments, silicon nitride is used as the passivation layer 40. In some embodiments, a thickness of the passivation layer 40 is in a range from about 1.0 µm to about 10 µm, and is in a range from about 2.0 µm to about 5.0 µm, from the top of the pad electrodes 30. The passivation layer 40 is formed by a suitable deposition operation, including PVD, CVD or ALD. As shown in FIG. 7, the passivation layer 40 has peaks above the pad electrodes 30 and valleys between the pad electrodes 30.

Further, in some embodiments, the passivation layer 40 is patterned by one or more lithography and etching operation to form openings over the pad electrodes 30 for outside electrical connection (by wire or by bump).

Figure 8A:
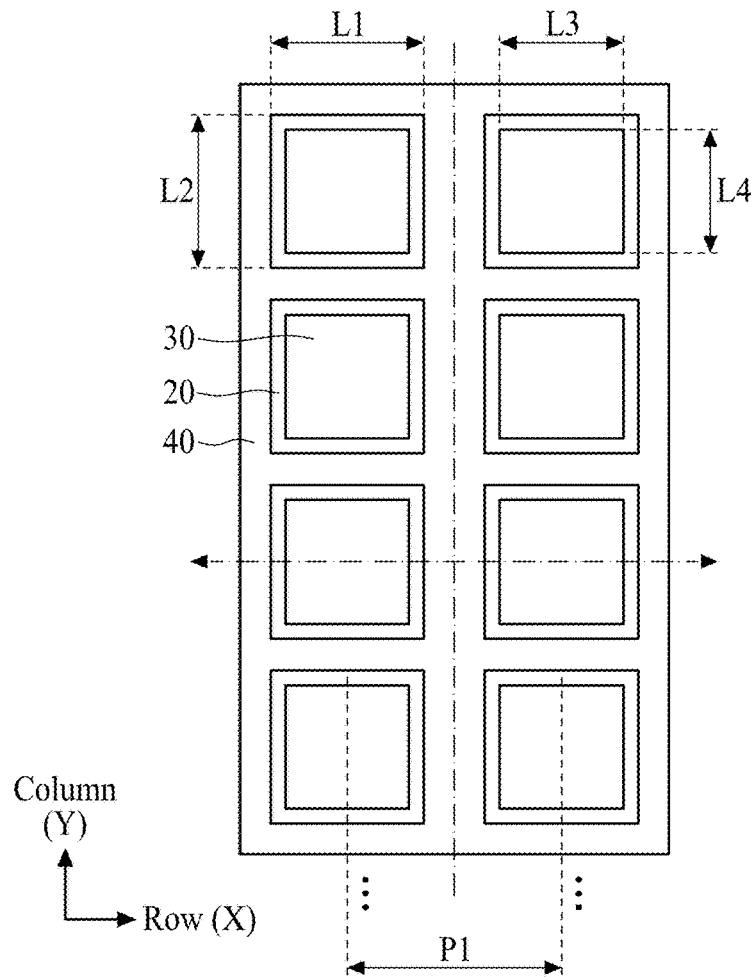
FIGS. 8A and 8B show views of a semiconductor device according to an embodiment of the present disclosure.

The topmost wiring patterns 20 are arranged in a row-column (X-Y) arrangement in some embodiments as shown in FIG. 8A. In some embodiments, the topmost wiring patterns 20 have a rectangular shape having first sides (width L1) along the row (X) direction and second sides (width L2) along the column (Y) direction in plan view. In some embodiments, 0.8≤L1/L2≤1.2, and in other embodiments, 0.95≤L1/L2≤1.05 (substantially square). In some embodiments, L1 and L2 are in a range from about 2 µm to 10 µm, and are in a range from about 4 µm to 6 µm in other embodiments. The rectangular or square shape of the topmost wiring patterns 20 have rounded corners in some embodiments in plan view. In some embodiments, the plurality of topmost wiring patterns 20 are arranged in a row-column arrangement having a pitch P1 of about 2.5 µm to about 15 µm (a space between adjacent wiring patterns 20 is in a range from about 0.5 µm to about 5.0 µm). In some embodiments, the pitch along the row direction is the same as or different from the pitch along the column direction. In some embodiments, a thickness of the topmost wiring patterns 20 is in a range from about 1.0 µm to about 5.0 µm, and is in a range from about 3.0 µm to about 4.0 µm in other embodiments.

A 2×4 arrangement of the topmost wiring patterns 20 is illustrated in FIG. 8A, but the disclosure is not limited to a 2×4 arrangement. In some embodiments, the arrangement is 2×N arrangement, where N is 4 or more (up to, for example, 100). Other arrangements, including a fewer or greater number of rows or columns of topmost wiring patterns 20 are included in the scope of this disclosure. For example, the arrangement may be an M×N arrangement, where M and N is a natural number, and at least one of M and N is 2 or more up to about 100. In some embodiments, the M×N arrangement has no other wiring patterns at the same wiring level within a distance L0 from the M×N arrangement, where L0 is twice to ten times the pitch of the M×N arrangement. In some embodiments, at least one of the row length or the column length of the matrix of the topmost wiring patterns 20 is in a range from about 200 µm to 2 mm.

Similarly, the pad electrodes 30 are arranged in a row-column arrangement in some embodiments as shown in FIG. 8A. In some embodiments, since the pad electrodes 30 are formed over the topmost wiring patterns 20, respectively, the arrangement or layout of the pad electrodes 30 is substantially the same as that of the topmost wiring patterns 20. In some embodiments, the pad electrodes 30 have a rectangular shape having first sides (width L3) along the row direction and second sides (width L4) along the column direction in plan view. In some embodiments, $0.8 \leq L3/L4 \leq 1.2$, and in other embodiments, $0.95 \leq L3/L4 \leq 1.05$ (substantially square). The rectangular or square shape of the pad electrodes 30 have rounded corners in some embodiments in plan view. In some embodiments, L3 and L4 are in a range from about 2 µm to 10 µm, and are in a range from about 4 µm to 6 µm in other embodiments. In some embodiments, L3 and L4 are smaller than L1 and L2, respectively.

Figure 8B:
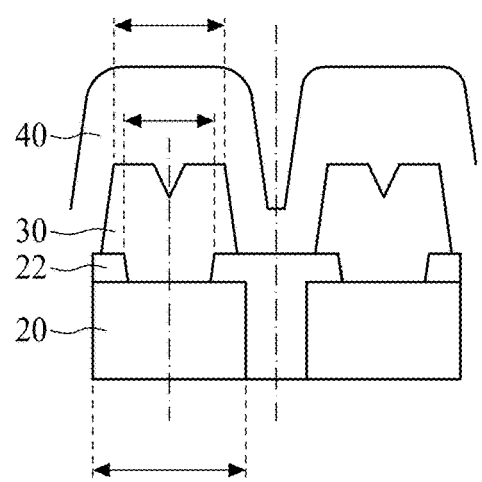

As shown in FIG. 8B, the passivation layer 40 has peaks above the pad electrodes 30 and valleys between the pad electrodes 30. In some embodiments, the bottom of the valley is located at a level between the top of the topmost wiring patterns 20 and the top of the pad electrodes 30. When the center line of the adjacent two rows of the pad electrodes 30 (upper portion above the top dielectric layer) and the center line of the adjacent two rows of the topmost wiring patterns 20, on which the two rows of the pad electrodes 30 are formed, are substantially aligned with each other (different is less than 0.1 µm), the bottom of the valley is located above the space between the topmost wiring patterns 20 as shown in FIG. 8B.

Figure 9A:
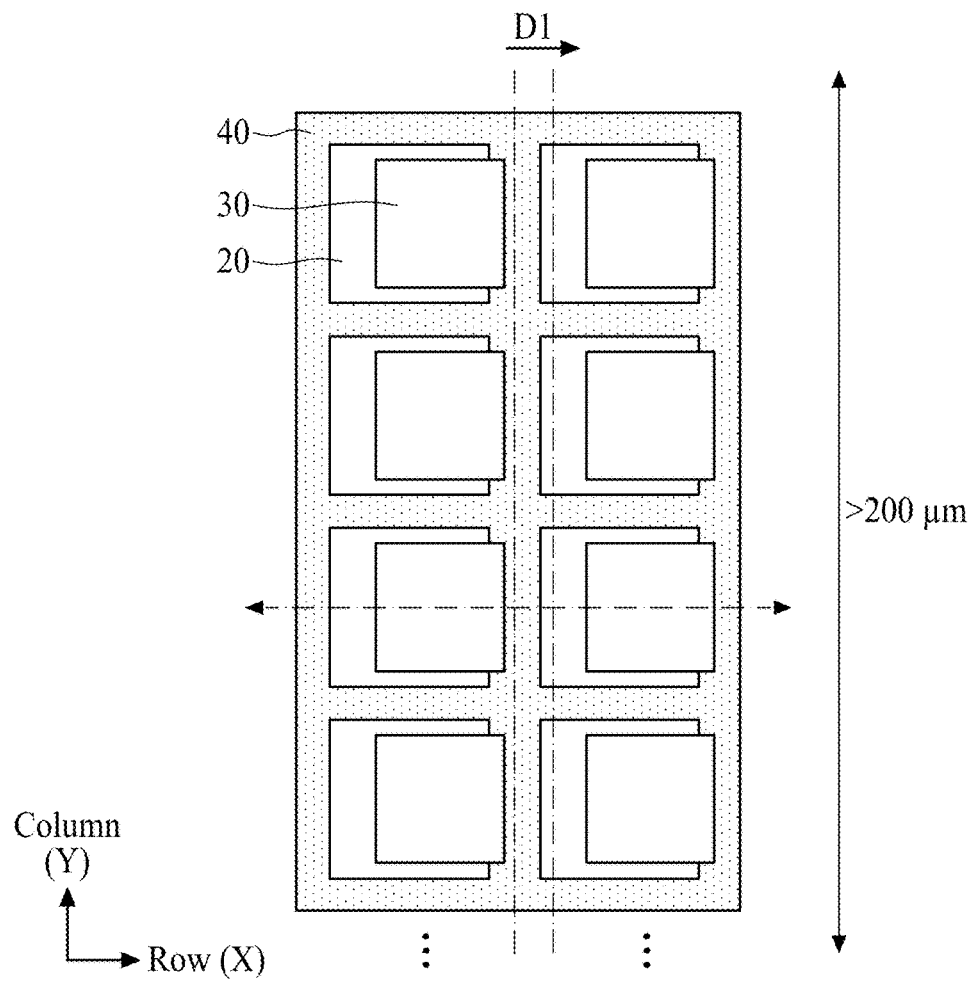
FIGS. 9A and 9B show views of a semiconductor device according to an embodiment of the present disclosure.
Figure 9B:
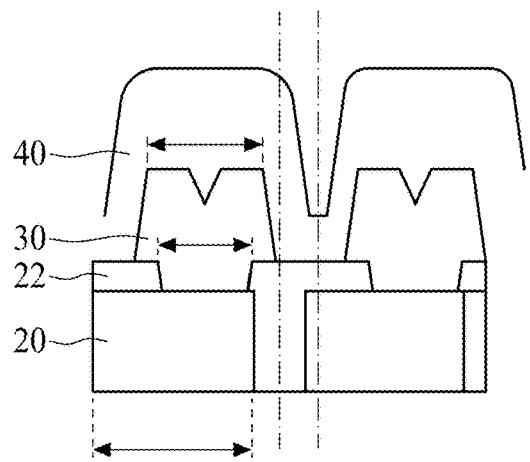

In some embodiments of the present disclosure, as shown in FIG. 9A, the center line of the adjacent two columns of the pad electrodes 30 is shifted, for example to + row direction, from the center line of the adjacent two columns of the topmost wiring patterns 20. In some embodiments, the shift amount D1 is more than 0.1 µm. In some embodiments, D1 is equal to or more than S1/2 (a half of S1), where S1 is a space between adjacent topmost wiring patterns 20 in the row direction (see, FIG. 10). When the shift amount D1 is equal to or more than S1/2, the center line of the adjacent two columns of the pad electrodes 30 overlaps one of the adjacent columns of the topmost wiring patterns as shown in FIGS. 9A and 9B. Accordingly, the bottom of the valley of the passivation layer 40 is also located above one of the adjacent columns of the topmost wiring patterns as shown in FIG. 9B. In some embodiments, the shift amount D1 is S1/2+Δ, where Δ is in a range from about 0.1 µm to about 1.0 µm (e.g., 0.1, 0.2, 0.3, 0.4 or 0.5 µm).

Figure 10:
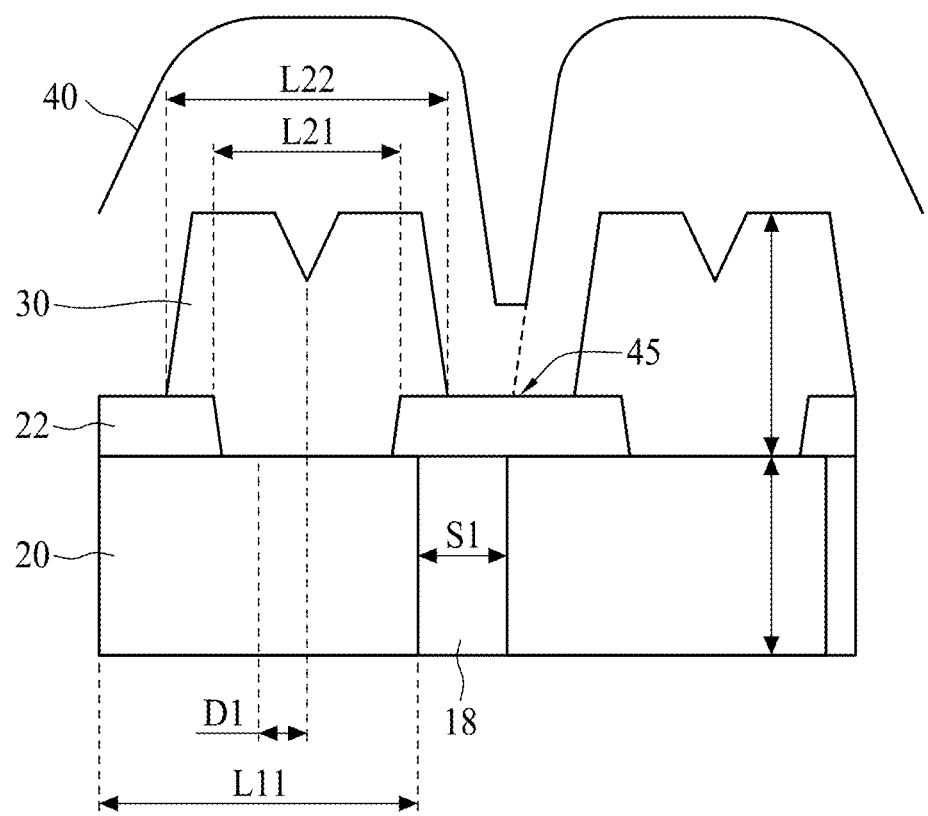
FIG. 10 shows a view of a semiconductor device according to an embodiment of the present disclosure.

When the length of the columns in the column direction is long, for example, more than about 200 µm, a long valley is formed in the passivation layer 40 along the space between two columns in the column direction. Such a long valley may cause a crack 45 in the passivation layer as shown in FIG. 10. In the present embodiments shown in FIGS. 9A and 9B, however, since the bottom of the valley, which can be an origin of the crack, is located above the topmost wiring patterns 20, the crack 45, if formed, stops at the surface of the topmost wiring patterns 20, and thus it is possible to prevent the crack from reaching the circuit region below the topmost wiring layers 20. Along the column direction, the crack may penetrate into the top dielectric layer 22 and ILD/IMD layers at the spaces between adjacent topmost wiring patterns 20, since the spaces between adjacent topmost wiring patterns 20 is sufficiently smaller than the size of the topmost wiring patterns 20, the crack 45 does not penetrate deeply into the top dielectric layer 22 and/or the ILD/IMD layers. In some embodiments, the bottom of the crack 45 is located between the top surface and bottom surface of the topmost wiring patterns 20 in the space between the topmost wiring patterns in the column direction.

In some embodiments, the width L11 of the topmost wiring pattern 20 is in a range from about 2 µm to 10 µm, and is in a range from about 4 µm to 6 µm in other embodiments. In some embodiments, the width L21 of the bottom of the pad electrode 30 is in a range from about 1.2 µm to 6 µm, and is in a range from about 2.4 µm to 3.6 µm in other embodiments. In some embodiments, the largest width L22 of the pad electrode 30 is in a range from about 1.6 µm to 8 µm, and is in a range from about 3.2 µm to 4.8 µm in other embodiments. In some embodiments, the space S1 is in a range from about 0.5 µm to 2.0 µm, and is in a range from about 0.8 µm to 1.2 µm in other embodiments.

In some embodiments, the shift amount D1 is set such that the outer edge of the opening 24 is within the topmost wiring pattern 20. In some embodiments, D1 corresponds to the difference between the center of the opening 24 (see, FIG. 3) and the center of the topmost wiring pattern 20 when a resist pattern 35 for the pad electrode 30 shown in FIG. 5 is aligned with the opening 24. In other words, the lower part (embedded in the top dielectric layer 22) of the pad electrode 30 and the upper part (above the upper surface of the top dielectric layer 22) of the pad electrode 30 are substantially aligned with each other (an overlay error is less than 0.1 µm in some embodiments). In some embodiments, D1 is equal to or more than S1/2 (a half of S1) and equal to or less than (L11-L21)/2. In some embodiments, the upper part of the pad electrode 30 has a thickness greater than the lower part of the pad electrode 30.

Figure 11:
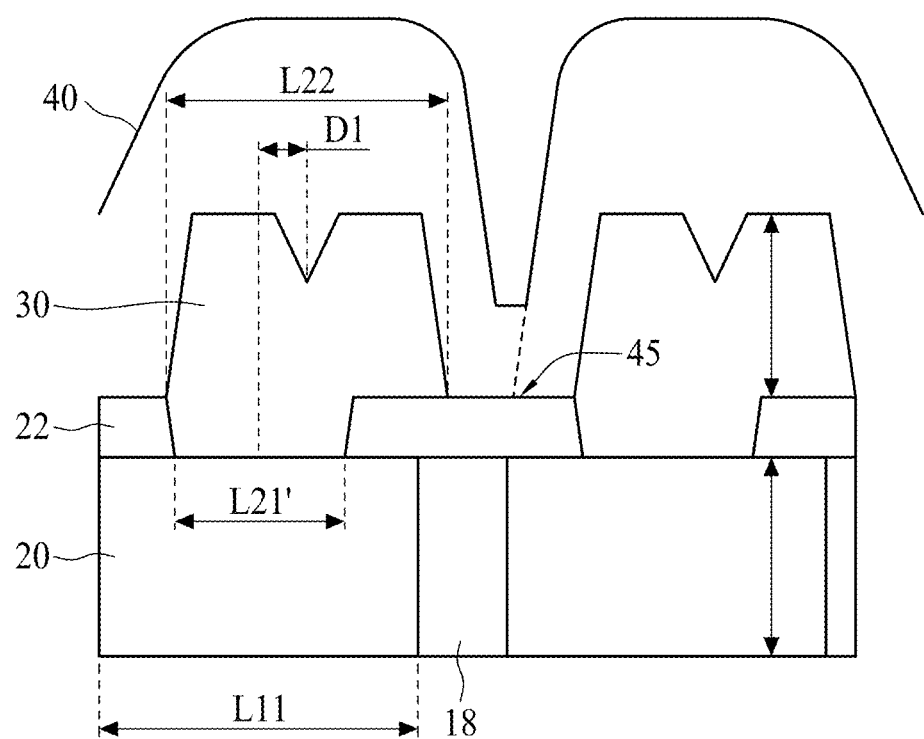
FIG. 11 shows a view of a semiconductor device according to an embodiment of the present disclosure.

In other embodiments, as shown in FIG. 11, the lower part (embedded in the top dielectric layer 22) of the pad electrode 30 is substantially aligned with the topmost wiring layer 20 (an overlay error is less than 0.1 µm in some embodiments), and the upper part of the pad electrode 30 is shifted by the shift amount D1. In some embodiments, D1 is equal to or more than S1/2 (a half of S1) and equal to or less than (L22-L21')/2, where the width L21' is a width of the top of the lower part of the pad electrode 30. In some embodiments, D1 is equal to or more than S1/2+Δ, where Δ is about 0.1 μm.

In other embodiments, both the lower part and the upper part of the pad electrode 30 are shifted with respect to the topmost wiring pattern 20 so that the upper part of the pad electrode 30 is shifted from the topmost wiring layer 20 by the amount D1.

Figure 12:
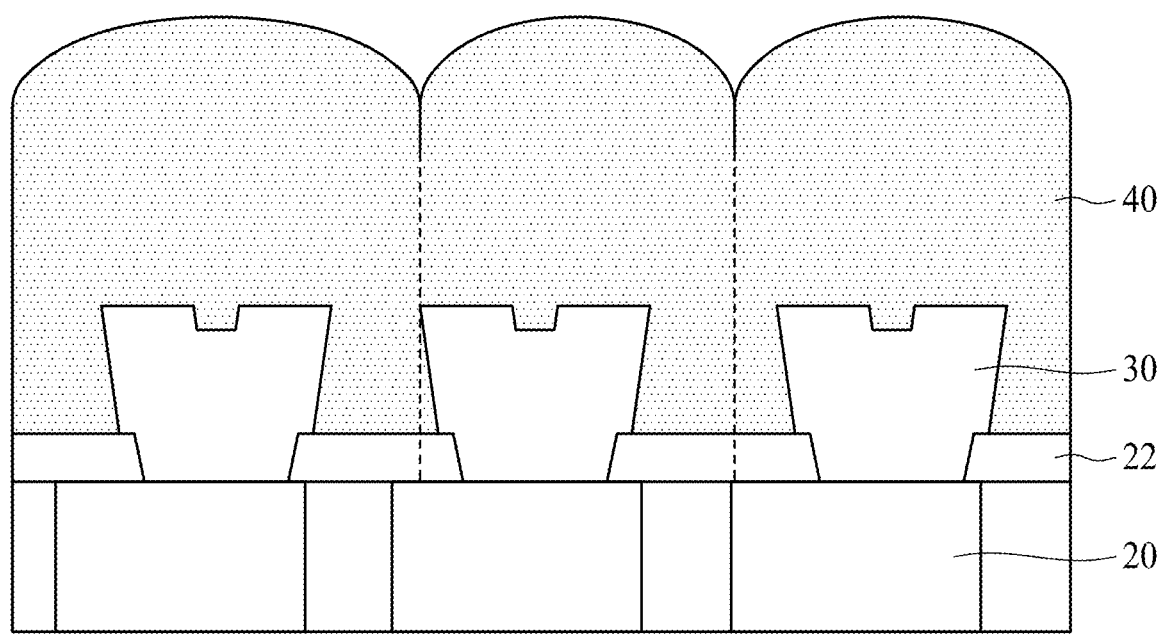
FIG. 12 shows a view of a semiconductor device according to an embodiment of the present disclosure.

FIG. 12 shows another embodiment, where the pad electrodes 30 have a reverse tapered shape. Similar to the foregoing embodiments, the pad electrodes 30 are relatively shifted from the topmost wiring patterns 20 so that the center line of the adjacent two columns of the pad electrodes 30 overlaps one or two columns of the topmost wiring pattern 20, on which the two columns of the pad electrodes 30 are formed. Accordingly, the valleys of the passivation layer 40 are located just above the topmost wiring patterns 20.

As is understood from FIGS. 8A and 9A, the structures shown in FIGS. 9A-11 are obtained by shifting one or both resist patterns for the opening 24 and the pad electrode 30 with respect to the topmost wiring patterns 20. Such a pattern shift can be achieved by inputting an overlay adjustment value (other than or in addition to a machine errors (so called "overlay error")) into a lithography apparatus using the original photo mask(s) which is designed to perfectly align the underlying pattern (e.g., the topmost wiring patterns). In such a case, there is no need to manufacture additional photo masks for patterning the opening 24 and/or the pad electrodes 30, and all patterns formed by using the photo mask are shifted by the same amount.

In other embodiments, new photo masks which have an intentional pattern shift are manufactured, and no overlay shift (other than minor adjustment) is input into a lithography apparatus when forming a resist pattern. In some embodiments, only certain necessary parts of the patterns are shifted.

Figure 13:
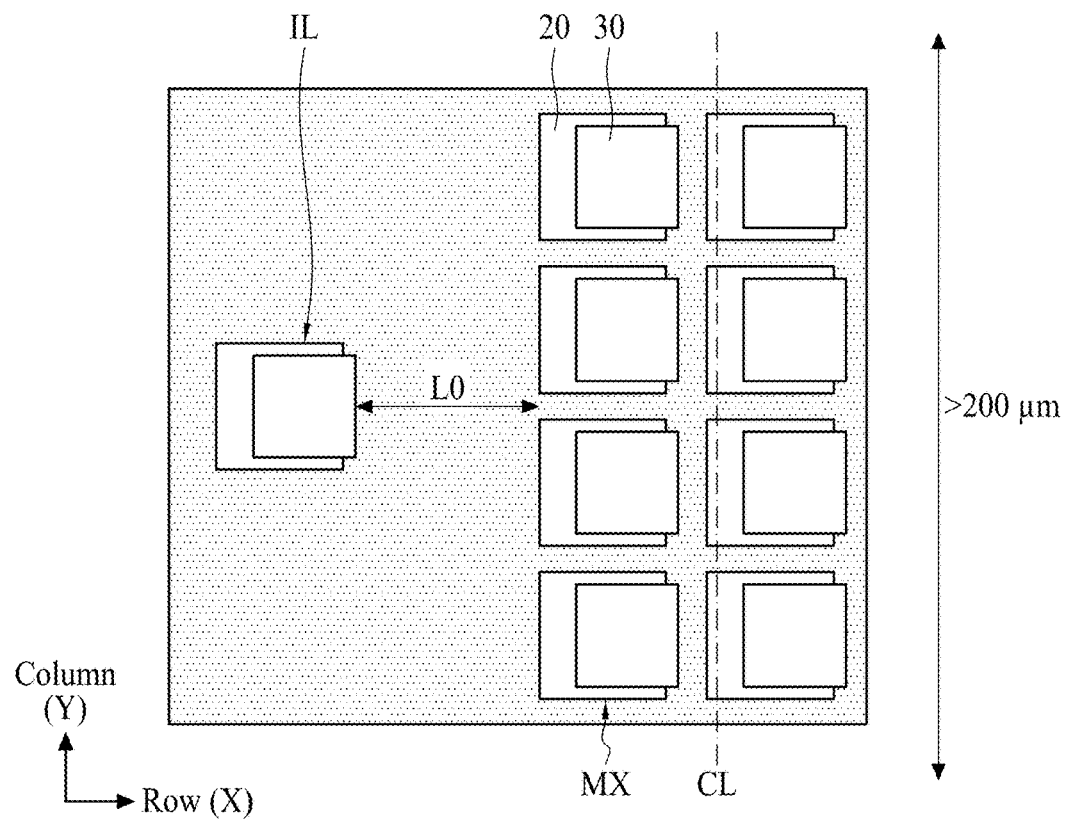
FIG. 13 shows a view of a semiconductor device according to an embodiment of the present disclosure.
Figure 14:
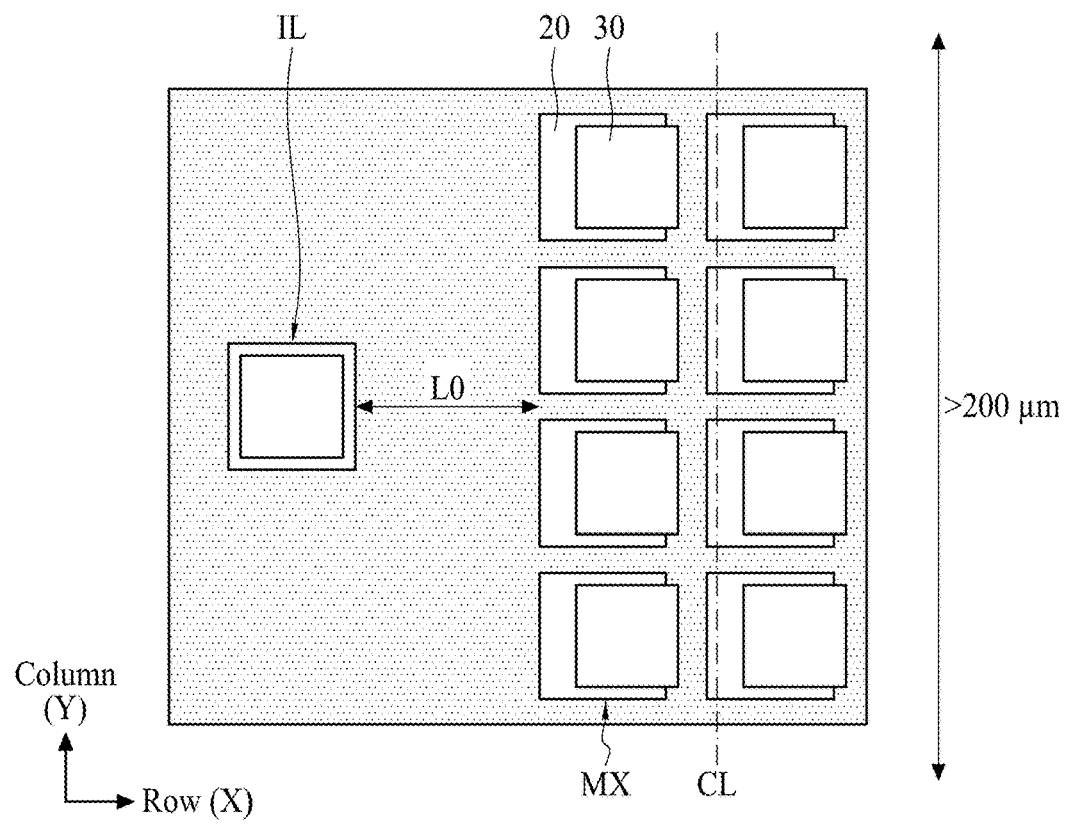
FIG. 14 shows a view of a semiconductor device according to an embodiment of the present disclosure.

FIGS. 13 and 14 show pattern layouts in accordance with embodiments of the present disclosure.

In some embodiments, the topmost wiring patterns 20 and the pad electrodes 30 include not only a matrix pattern MX but also one or more island patterns IL as shown in FIGS. 13 and 14. In some embodiments, the island pattern IL is separated from the matrix pattern or separated from the closest pattern by a distance L0, where L0 is twice to ten times or more the pitch of the matrix arrangement. When the passivation layer 40 is formed, the passivation layer forms a gentle upper surface profile above the island pattern IL, and thus substantially no valley is formed around the island patterns, because of a sufficiently long distance from the adjacent (e.g., closest) pattern.

In some embodiments, as shown in FIG. 13, both the pad electrodes 30 of the matrix pattern MX and the island pattern IL are shifted in the row direction with respect to the topmost wiring patterns 20. As shown in FIG. 13, the center line CL of the adjacent two columns of the pad electrodes 30 of the matrix pattern overlaps one of two columns of the topmost wiring pattern 20 in plan view. As set forth above, this can be achieved by inputting an overlay adjustment value into the lithography apparatus using the original photo mask, or using a specifically manufactured photo mask. In some embodiments, as shown in FIG. 13, the topmost wiring patterns 20 include one or more patterns on which no pad electrode is formed.

In other embodiments, as shown in FIG. 14, while the entirety of the pad electrodes 30 of the matrix pattern MX is shifted in the row direction with respect to the entirety of the topmost wiring patterns 20, the pad electrode 30 of the island pattern IL is substantially aligned (not shifted or shift amount less than 0.1 μm which may be caused by machine errors (so called "overlay error")) with the corresponding topmost wiring pattern 20. As set forth above, this can be achieved by using a specifically manufactured photo mask.

In some embodiments, island patterns that do not require the pattern shift include a small matrix having row or column length less than 100 μm. In some embodiments, one or more island patterns IL as shown in FIG. 13 or 14, are a dummy pattern, a pattern for measurement (overlay or alignment), or a part of a test circuit, which are disposed on a scribe lane surrounding a semiconductor chip.

Figure 15:
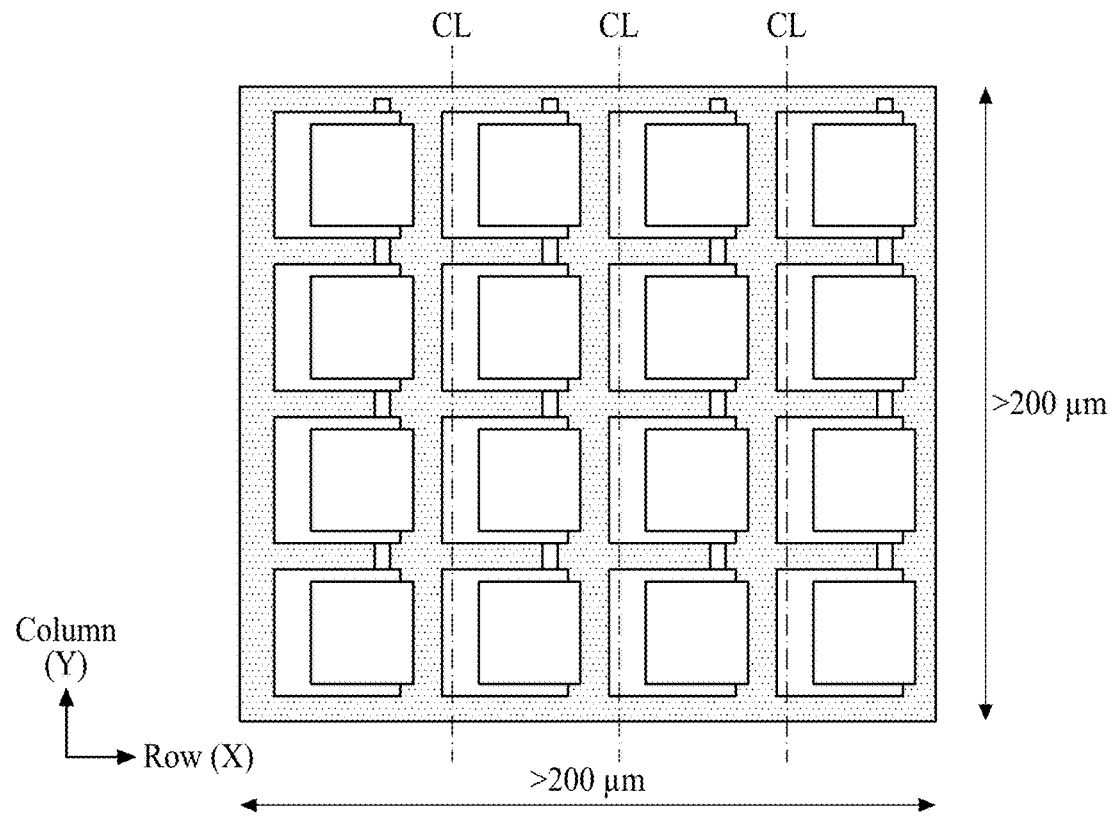
FIG. 15 shows a view of a semiconductor device according to an embodiment of the present disclosure.
Figure 16:
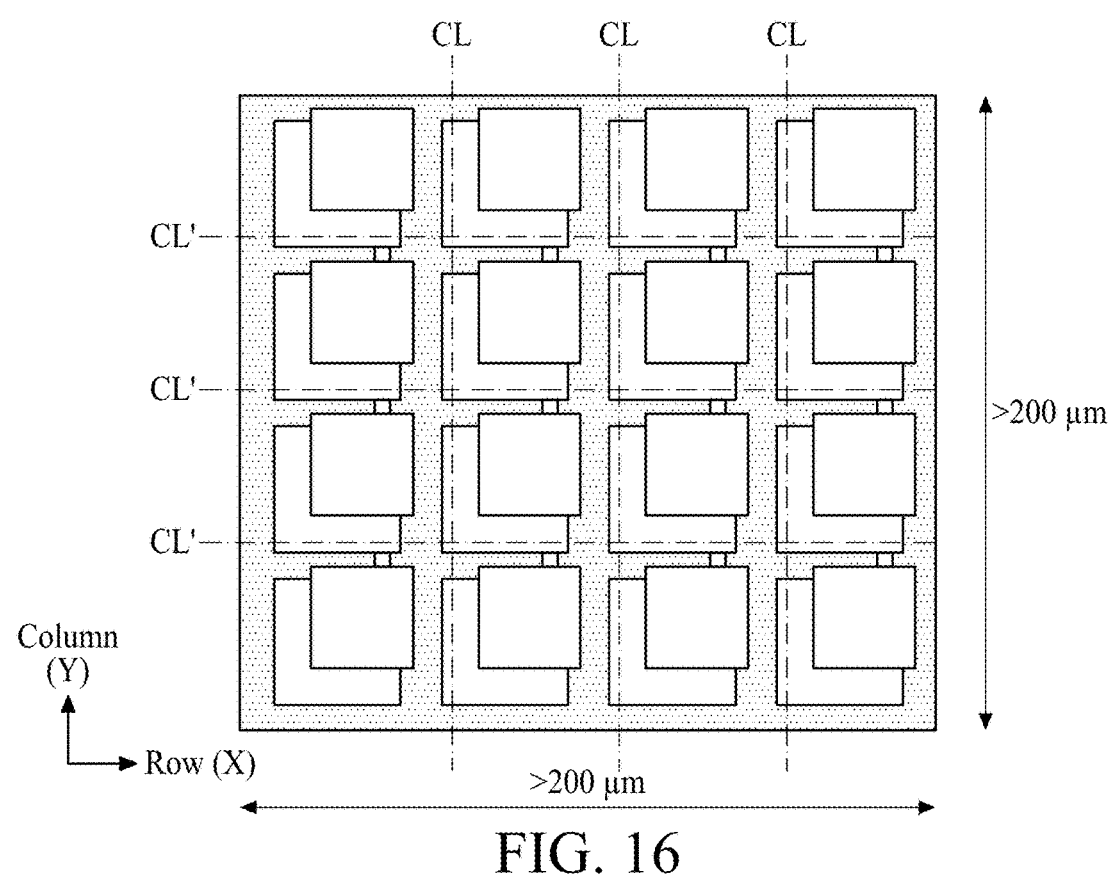
FIG. 16 shows a view of a semiconductor device according to an embodiment of the present disclosure.

FIGS. 15 and 16 show pattern layouts in accordance with embodiments of the present disclosure.

In some embodiments, the pattern matrix of the topmost wiring patterns 20 and the pad electrodes 30 is an M×N arrangement, where M and N are four or more, and/or the row and/or column length is more than 100 μm.

In some embodiments, as shown in FIG. 15, the entire matrix of the pad electrodes 30 is shifted only in one direction, e.g., row direction so that the center line CL of the adjacent two columns of the pad electrodes 30 overlaps one of two columns of the topmost wiring pattern 20, on which the two columns of the pad electrodes 30 are formed. In some embodiments, the center (a geometric center or a center of gravity) of the matrix of the pad electrodes 30 (in particular upper portions) is shifted by the shift amount with respect to the center of the matrix of the topmost wiring patterns 20 in one direction.

In other embodiments, as shown in FIG. 16, the entire matrix of the pad electrodes 30 is shifted in both row and column directions so that the center line CL of the adjacent two columns of the pad electrodes 30 overlaps one of two columns of the topmost wiring pattern 20, and the center line CL' of the adjacent two rows of the pad electrodes 30 overlaps one of two rows of the topmost wiring pattern 20. In some embodiments, the center of the matrix of the pad electrodes 30 (in particular upper portions) is shifted by the shift amount with respect to the center of the matrix of the topmost wiring patterns 20 in two directions.

Figure 17:
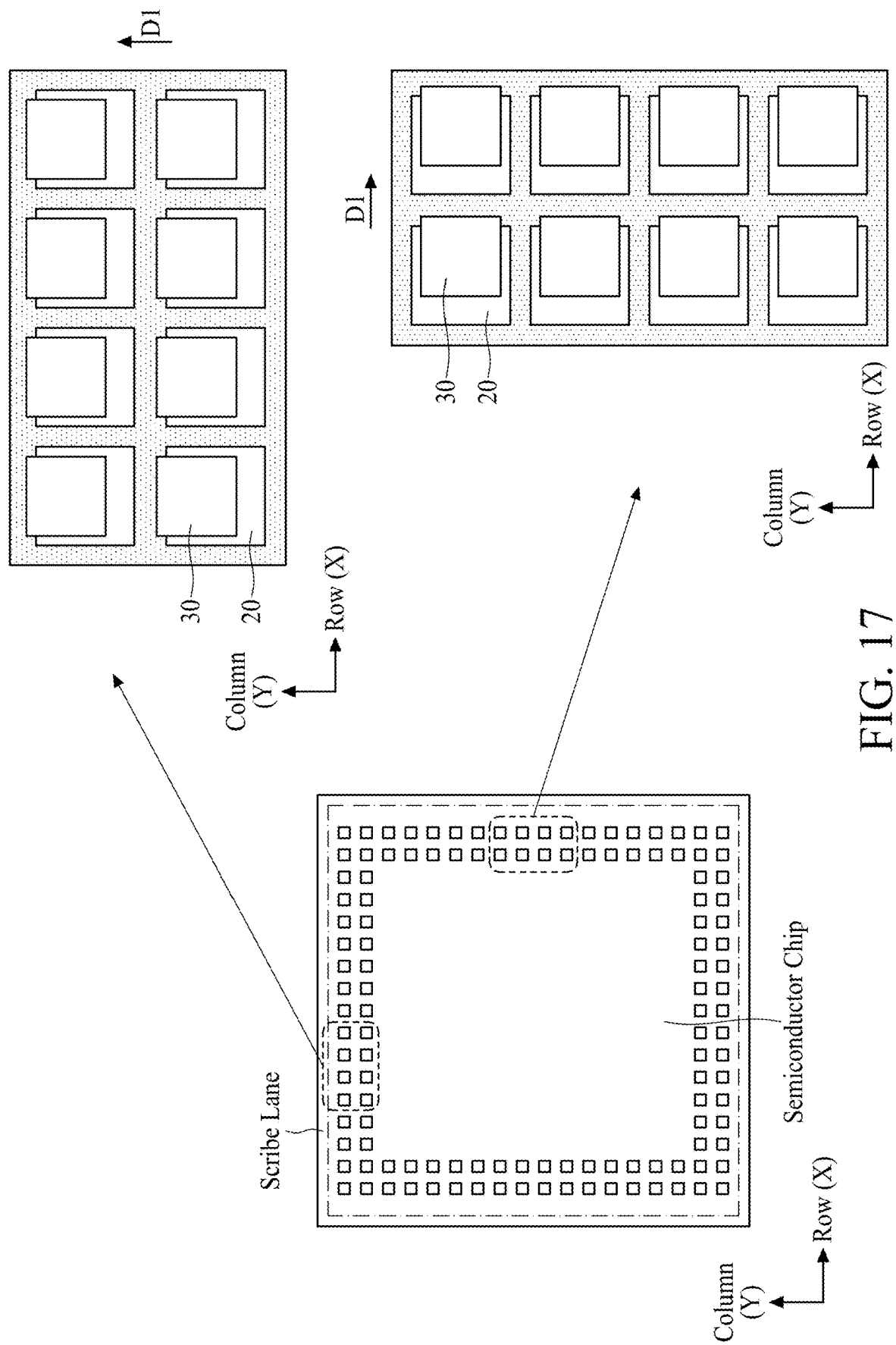
FIG. 17 shows a view of a semiconductor device according to an embodiment of the present disclosure.

FIG. 17 shows pattern layouts in accordance with embodiments of the present disclosure.

In some embodiments, the pad electrodes 30 are arranged around the periphery of the semiconductor chip as shown in FIG. 17. In some embodiments, the periphery or a peripheral area of the semiconductor chip is an area within 500 μm from a border between the chip area (circuit area) and scribe lines. In some embodiments, two columns of pad electrode are arranged at left and right sides of the semiconductor chip and two rows of pad electrodes are arranged at top and bottom sides of the semiconductor chip.

In some embodiments, the columns of the pad electrodes 30 located at the left and the right of the semiconductor chip are shifted along the row direction (left to right) so that the center line of the adjacent two columns of the pad electrodes 30 overlaps one of two columns of the topmost wiring pattern 20, on which the two columns of the pad electrodes 30 are formed. In some embodiments, the rows of the pad electrodes 30 located at the top and the bottom of the semiconductor chip are shifted along the column direction (top to bottom) so that the center line of the adjacent two rows of the pad electrodes 30 overlaps one of two rows of the topmost wiring pattern 20, on which the two rows of the pad electrodes 30 are formed.

In some embodiments, the shift direction of the columns of the pad electrodes 30 located at the left is the same as the shift direction of the columns of the pad electrodes 30 at the right of the semiconductor chip, for example, to the left with respect to the topmost wiring patterns, as shown in FIG. 17. In other embodiments, the shift direction of the columns of the pad electrodes 30 located at the left is different from the shift direction of the columns of the pad electrodes 30 at the right of the semiconductor chip with respect to the topmost wiring patterns. Similar arrangements are applied to the rows of the pad electrodes located at the top and the bottom of the semiconductor chip. In some embodiments, the pad electrodes 30 are shifted toward the outside the semiconductor chip with respect to the topmost wiring patterns at four sides of the semiconductor chip, and in other embodiments, the pad electrodes are shifted toward the inside the semiconductor chip with respect to the topmost wiring patterns at four sides of the semiconductor chip.

In some embodiments, the rows of the pad electrodes 30 and the columns of the pad electrodes 30 are shifted both in the row direction and the column direction with respect to the topmost wiring patterns similar to FIG. 16.

Figure 18:
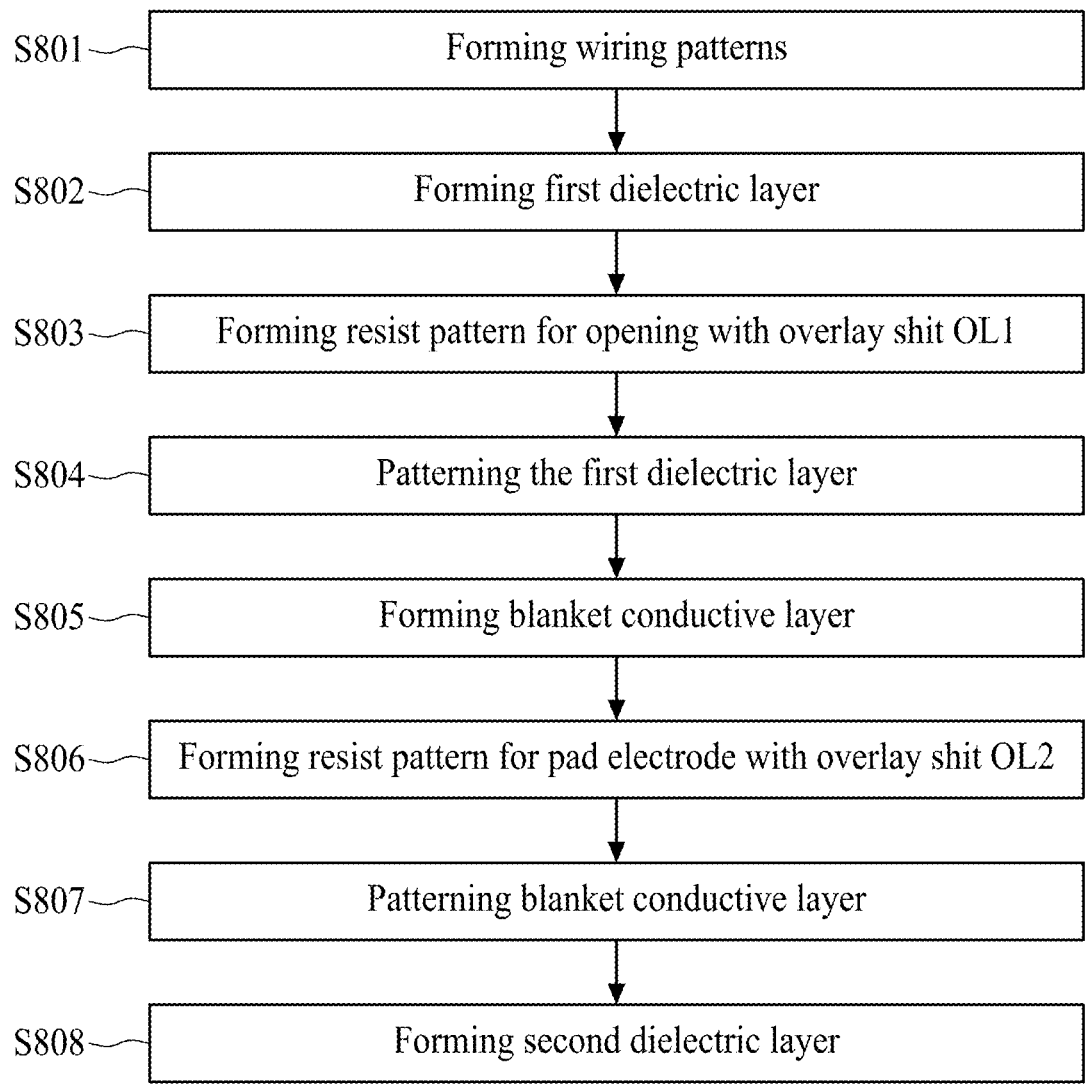
FIG. 18 shows a flow of a sequential manufacturing operation of a semiconductor device according to an embodiment of the present disclosure.

FIG. 18 shows a flow chart of manufacturing a semiconductor device according to an embodiment of the present disclosure. It is understood that additional operations can be provided before, during, and after processes shown in FIG. 18, and some of the operations described below can be replaced or eliminated, for additional embodiments of the method. The order of the operations/processes may be interchangeable.

In the above embodiments, the patterns 20 are a topmost wiring pattern, which is the closest wiring layer to the pad electrode in the vertical direction and connected to the pad electrode, and the patterns 30 are pad electrodes. However, the configuration is not limited to this. In other embodiments, the pattern 30 is an under bump metallization (UBM) layer, on which a bump electrode is formed.

At process block S801, wiring patterns, for example, the topmost wiring patterns 20 as set forth above, are formed in an ILD layer over a substrate. At process block S802, a first dielectric layer, for example, the top dielectric layer 22 as set forth above, is formed over the wiring pattern formed in the ILD layer. At process block S803, a first resist pattern for forming openings/windows, for example, openings 24 as set forth above, is formed over the first dielectric layer. In some embodiments, an overlay shift amount OL1 in addition to an overlay compensation value caused by an imperfection of alignment process is implemented in the lithography process. In some embodiments, the overlay shift amount OL1 of less than 0.1 µm is implemented in the lithography process. In some embodiments, OL1 is set relative to the wiring patterns. At process block S804, the first dielectric layer is patterned using the first resist pattern as an etching mask to form openings, for example openings 24 as set forth above, over the wiring patterns. At process block S805, a blanket conductive layer, for example conductive layer 30L as set forth above, is formed in the openings and on the first dielectric layer. At process block S806, a second resist pattern for forming electrodes, for example, pad electrodes 30 as set forth above, is formed over the conductive layer. In some embodiments, an overlay shift amount OL2 in addition to an overlay compensation value caused by imperfection of alignment process (about less than 0.1 µm) is implemented in the lithography process. At process block S807, the blanket conductive layer is patterned using the second resist pattern as an etching mask to form an electrode, for example, a pad electrode 30 as set forth above. At process block S808, a second dielectric layer, for example, a passivation layer 40 as set forth above is formed over the first dielectric layer and the patterned electrodes.

In some embodiments, one or both of the photomasks used in the process blocks S804 and S806 are designed such that the electrode or the electrode and openings are aligned with the corresponding wiring patterns. In such a case, the overlay shift amounts OL2 with respect to the wiring patterns is set to more than 0.1 µm, or S1/2+Δ, where S1 is a space between the wiring patterns, and Δ is in a range from about 0.1 µm to about 1.0 µm. In some embodiments, OL1 is zero. In other embodiments, the sum of overlay shift amounts OL1+OL2 with respect to the wiring patterns is set to more than 0.1 µm, or S1/2+Δ, where S1 is a space between the wiring patterns, and Δ is in a range from about 0.1 µm to about 1.0 µm, when the OL2 is set relative to the opening.

In some embodiments, one or both of the photomasks used in the process blocks S804 and S806 are designed such that the electrodes are shifted with respect to the corresponding wiring patterns. In such a case, OL1 and OL2 are both zero and only an overlay compensation value caused by imperfection of alignment process, if necessary, is input to the lithography apparatus.

Figure 19:
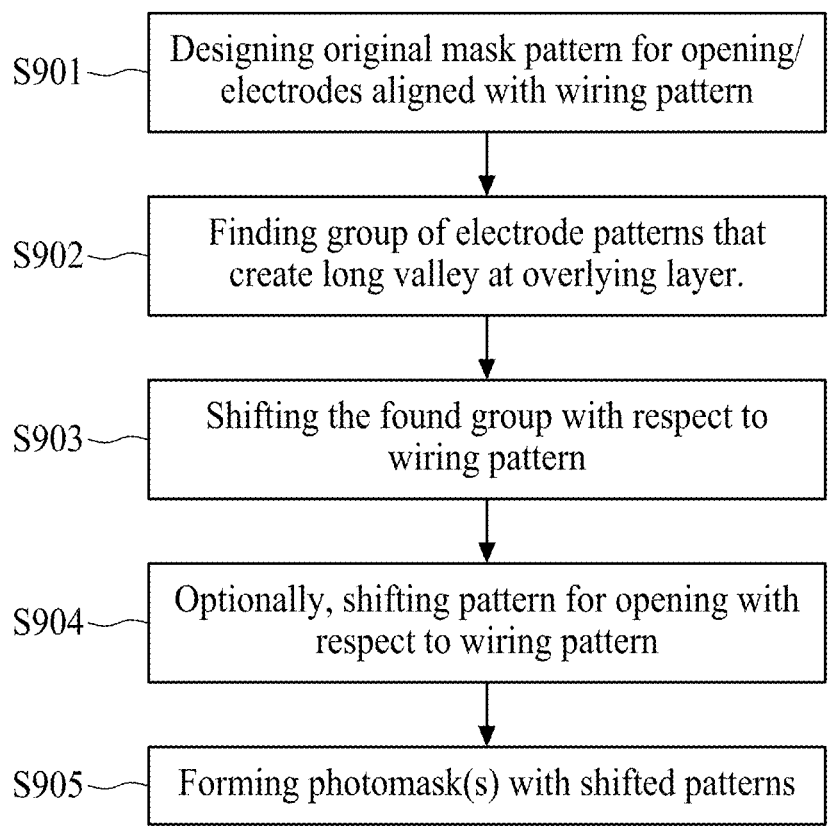
FIG. 19 shows a flow of a sequential manufacturing operation of a photomask according to an embodiment of the present disclosure.

FIG. 19 shows a flow chart of manufacturing a photomask according to embodiments of the present disclosure. It is understood that additional operations can be provided before, during, and after the processes shown in FIG. 19, and some of the operations described below can be replaced or eliminated, for additional embodiments of the method. The order of the operations/processes may be interchangeable.

At process block S901, an original layout for opening patterns, for example, openings 24 (first resist pattern 25) and an original layout for electrode patterns, for example, pad electrodes 30 are prepared. In the original layout, the opening patterns and the electrode patterns are designed to align with the underlying pattern, such as the wiring pattern on which the openings are formed (for example, topmost wiring patterns 20). Similar to the configuration shown in the embodiments of FIG. 8A, the center line of the adjacent two rows of the electrode patterns is aligned with the center line of the adjacent two rows of the wiring patterns.

At process block S902, one or more groups of electrode patterns (row and/or columns) that would create a long valley (e.g., more than 200 µm) at an overlying insulating layer are searched for and detected. In some embodiments, when the electrode patterns are arranged in at least two rows and/or columns, the space between adjacent rows/columns is within a predetermined range and the length of the rows/columns is more than a threshold length, it is determined that the groups of electrode patterns would create a long valley at an overlying insulating layer. This can be achieved by one or more resizing and/or Boolean operations of the patterns. For example, by expanding pattern in one direction (both side), spaces having a dimension smaller than the threshold length are eliminated, thereby forming continuous pattern, and then it is determined that the length of the continuous patterns is more than the threshold length. In some embodiments, the predetermined range is from about 0.5 µm to 2.0 µm, and is from about 0.8 µm to 1.2 µm in other embodiments. In some embodiments, the threshold length is about 200 µm and is about 400 µm in other embodiments.

At process block S903, when the critical group of patterns are found, the group of electrode patterns are shifted in a direction crossing the valley, which would otherwise be appear, by a shift amount. The shift amount is determined such that the centerline of the adjacent rows/columns of the electrode patterns overlaps the underlying wiring patterns as explained above.

In some embodiments, the opening patterns corresponding to the critical group of electrode patterns are shifted at process block S904 by the same or different shift amount as the shift amount of the electrode patterns.

Then, at process block S905, modified layout is output as mask data, and one or more photomask is manufactured according to the mask data, and the manufactured photomask is used, for example, in the process shown in FIG. 18.

In some embodiments, the process shown in FIG. 19, in particular S901-S904, is performed by a computer system including one or more processors and storage media (memories) that store a program. When the program is executed, the executed program can perform at least a part of the operations shown in FIG. 19.

In some embodiments, one or more of the process blocks S901-S904 are performed by a computer system. In some embodiments, the computer system is provided with a computer including an optical disk read only memory (e.g., CD-ROM or DVD-ROM) drive and a magnetic disk drive, a keyboard, a mouse, and a monitor. The computer is provided with, in addition to the optical disk drive and the magnetic disk drive, one or more processors, such as a micro processing unit (MPU), a ROM in which a program such as a boot up program is stored, a random access memory (RAM) that is connected to the MPU and in which a command of an application program is temporarily stored and a temporary storage area is provided, a hard disk in which an application program, a system program, and data are stored, and a bus that connects the MPU, the ROM, and the like. Note that the computer system may include a network card (not shown) for providing a connection to a LAN. The program for causing the computer system to execute the functions of an apparatus for performing the aforementioned mask data generating operation may be stored in an optical disk or a magnetic disk, which are inserted into the optical disk drive or the magnetic disk drive, and transmitted to the hard disk. Alternatively, the program may be transmitted via a network (not shown) to the computer and stored in the hard disk. At the time of execution, the program is loaded into the RAM. The program may be loaded from the optical disk or the magnetic disk, or directly from a network. The program does not necessarily have to include, for example, an operating system (OS) or a third party program to cause the computer to execute the functions of a photo mask data generation apparatus in the foregoing embodiments. The program may only include a command portion to call an appropriate function (module) in a controlled mode and obtain desired results.

FIG. 20 shows an advantageous effect of the present embodiments. Various samples having different row/column length ("PRL") and different shift amounts were fabricated and a number of cases in which the crack in the passivation layer (silicon nitride of 200 nm) reaches below the topmost wiring patterns was counted. Pattern space S1 between adjacent ones of the topmost wiring layers was 0.75 µm.

As shown in FIG. 20, when the length of the row/columns is longer (e.g., 400 µm or more), cracks that penetrated below the topmost wiring patterns occurred (about 0.2%), but when the sufficient overlay shift was introduced according to embodiments of the disclosure, such cracks were eliminated.

In the foregoing embodiments, even if a long valley portion in a passivation layer, which may be an origin of a crack, is formed by a topography of rows and/or columns of pad electrode patterns, since the rows/columns of the pad electrode patterns are shifted with respect to the underlying wiring patterns so that the valley is located above the underlying wiring patterns, it is possible to prevent the crack from penetrating below the wiring patterns. In some embodiments, such a pattern shift is achieved by introducing an overlay shift in an exposure apparatus and no new photomask is necessary.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, lower conductive patterns are formed. The lower conductive patterns include a first column of patterns in which a plurality of conductive patterns are arranged in a first direction and a second column of patterns in which a plurality of conductive patterns are arranged in the first direction, and the first column and the second column are adjacent to each other in a second direction crossing the first direction in plan view. Upper conductive patterns are formed. The upper conductive patterns include a third column of patterns in which a plurality of conductive patterns are arranged in the first direction and a fourth column of patterns in which a plurality of conductive patterns are arranged in the first direction, and the third column and the fourth column are adjacent to each other in the second direction in plan view. The first column and the third column at least partially overlap with each other in plan view, the second column and the fourth column at least partially overlap with each other in plan view, and the upper conductive patterns are formed such that a first center line extending in the first direction of the first and second columns is shifted in the second direction by a shift amount more than 0.1 µm from a second center line extending in the first direction of the third and fourth columns in plan view. In one or more of the foregoing or following embodiments, the second center line overlaps the second column in plan view. In one or more of the foregoing or following embodiments, the forming upper conductive patterns comprises forming a resist pattern corresponding to the upper conductive patterns by a lithography apparatus, and in the lithography operation, an overlay shift other than zero in the second direction is input to the lithography apparatus so that the first center line extending in the direction of the first and second columns is shifted in the second direction from the second center line extending in the direction of the third and fourth columns in plan view. In one or more of the foregoing or following embodiments, an insulating layer is further formed over the upper conductive lines. In one or more of the foregoing or following embodiments, the insulating layer comprises peaks over the third column and the fourth column, and a valley between the third column and the fourth column. In one or more of the foregoing or following embodiments, the valley overlaps the second column. In one or more of the foregoing or following embodiments, the insulating layer comprises a crack from the valley to at least one of the plurality of conductive patterns of the second column. In one or more of the foregoing or following embodiments, a space between the first column and the second column is smaller than a space between the third column and the fourth column. In one or more of the foregoing or following embodiments, the shift amount is greater than a half of the space between the first column and the second column. In one or more of the foregoing or following embodiments, the space between the first column and the second column is in a range from 0.8 µm to 1.2 µm, the space between the third column and the fourth column is in a range from 1.6 µm to 2.4 µm, and the shift amount is in a range from 0.8 µm to 1.0 µm. In one or more of the foregoing or following embodiments, a total length of the first column is more than 200 µm. In one or more of the foregoing or following embodiments, each of the plurality of conductive patterns in the first and second columns has a square shape with rounded corners in plan view. In one or more of the foregoing or following embodiments, each of the plurality of conductive patterns in the third and fourth columns has a square shape with rounded corners in plan view.

In accordance with another aspect of the present disclosure, in a method of fabricating a semiconductor device, a plurality of first conductive patterns arranged in a first direction and embedded in a first dielectric layer are formed. A second dielectric layer is formed over the plurality of first conductive patterns and the first dielectric layer. A plurality of openings in the second dielectric layer each over a corresponding one of the plurality of first conductive patterns are formed by a first patterning operation. A blanket layer of a conductive material is formed over the second dielectric layer and in the plurality of opening. The blanket layer of the conductive material is patterned to form a plurality of second conductive patterns connected to a corresponding one of the plurality of first conductive patterns by a second patterning operation. A third dielectric layer is formed over the plurality of second conductive patterns. In the first patterning operation, the plurality of openings as a whole are shifted in the first direction by a shift amount more than 0.1 µm from the plurality of first conductive pattern as a whole in plan view. In one or more of the foregoing or following embodiments, a center line of adjacent two of the plurality of first conductive patterns in the first direction is shifted in the first direction by the shift amount from a center line of adjacent two of the plurality of second conductive patterns in the first direction in plan view. In one or more of the foregoing or following embodiments, a thickness of the plurality of first conductive patterns is greater than a thickness of the plurality of second conductive pattern above the second dielectric layer. In one or more of the foregoing or following embodiments, the thickness of the plurality of first conductive patterns is in a range from 3 µm to 5 µm, and the thickness of the plurality of second conductive pattern above the second dielectric layer is in a range from 1.0 µm to 3.0 µm. In one or more of the foregoing or following embodiments, a top size of each of the plurality of openings is smaller than a largest width of each of the plurality of second conductive patterns.

In accordance with another aspect of the present disclosure, in a method of fabricating a semiconductor device, lower conductive patterns arranged in a column-row matrix are formed, wherein a first space between adjacent columns is in a range from 0.8 µm to 1.2 µm. A first dielectric layer is formed over the lower conductive patterns. Upper conductive patterns are formed over the lower conductive patterns and are arranged in a column-row matrix, and a second space between adjacent columns is greater than a first space. A center line of adjacent columns of the lower conductive patterns is shifted in a row direction by a shift amount more than 0.1 µm from a center line of adjacent two columns of the plurality of upper conductive patterns in plan view. In one or more of the foregoing or following embodiments, a first island pattern is provided at a same level as the lower conductive patterns, a second island pattern is provided at a same level as the upper conductive patterns, and a center of the first island pattern is aligned with a center of the second island pattern.

In accordance with another aspect of the present disclosure, a semiconductor device includes a semiconductor circuit disposed over a substrate; lower conductive patterns disposed over and electrically coupled to the semiconductor circuit, wherein the lower conductive patterns include a first column of patterns in which a plurality of conductive patterns are arranged in a first direction and a second column of patterns in which a plurality of conductive patterns are arranged in the first direction, and the first column and the second column are adjacent to each other in a second direction crossing the first direction; a first dielectric layer disposed over the lower conductive patterns; upper conductive patterns disposed over the lower conductive patterns, wherein the upper conductive patterns include a third column of patterns in which a plurality of conductive patterns are arranged in the first direction and a fourth column of patterns in which a plurality of conductive patterns are arranged in the first direction, and the third column and the fourth column are adjacent to each other in the second direction; and a second dielectric layer disposed over the upper conductive patterns. A first center line extending in the first direction between the first and second columns is shifted in the second direction by a shift amount more than 0.1 µm from a second center line extending in the first direction between the third and fourth columns in plan view. In one or more of the foregoing or following embodiments, the second center line overlaps one of the first column or the second column. In one or more of the foregoing or following embodiments, the shift amount is more than S/2 where S is a space between the first column and the second column. In one or more of the foregoing or following embodiments, the shift amount is more than S/2+0.1 µm. In one or more of the foregoing or following embodiments, S is in a range from 0.8 µm to 1.2 µm. In one or more of the foregoing or following embodiments, the second dielectric layer comprises peaks over the third column and the fourth column, and a valley between the third column and the fourth column. In one or more of the foregoing or following embodiments, the valley overlaps one of the first column or the second column in plan view. In one or more of the foregoing or following embodiments, the second dielectric layer comprises a crack from the valley to at least one of the plurality of conductive patterns of the second column. In one or more of the foregoing or following embodiments, the crack does not penetrate below bottoms of the lower conductive patterns. In one or more of the foregoing or following embodiments, the lower conductive patterns have a rectangular shape in plan view having first sides with a width L1 along the first direction and second sides with a width L2 along the second direction in plan view, and $0.95 \leq L1/L2 \leq 1.05$. In one or more of the foregoing or following embodiments, the upper conductive patterns have a rectangular shape in plan view having first sides with a width L3 along the first direction and second sides with a width L4 along the second direction in plan view, and $0.95 \leq L3/L4 \leq 1.05$. In one or more of the foregoing or following embodiments, the widths L3 and L4 are smaller than the widths L1 and L2.

In accordance with another aspect of the present disclosure, a semiconductor device includes a semiconductor circuit disposed over a substrate; wiring patterns embedded in a first interlayer dielectric (ILD) layer, and disposed over and electrically coupled to the semiconductor circuit; a second ILD layer disposed over the wiring patterns; pad electrodes disposed over and connected to the wiring patterns, respectively; and a passivation layer disposed over the pad electrodes. Each of the pad electrodes includes a lower portion embedded in the second ILD layer and an upper portion above a surface of the second ILD layer. The wiring patterns comprise a first matrix of patterns, and upper portions of the pad electrodes comprise a second matrix of patterns. A center of the second matrix is laterally shifted by a shift amount more than 0.1 µm with respect to a center of the first matrix in plan view. In one or more of the foregoing or following embodiments, each of the first matrix and the second matrix is an M×N matrix, where M and N are natural number and at least one of M or N is 4 or more, and at least one of a column length and a column length of the M×N matrix is more than 100 µm. In one or more of the foregoing or following embodiments, M is 2 and N is 4 or more. In one or more of the foregoing or following embodiments, the shift amount is more than S/2+0.1 µm, where S is a space between adjacent wiring patterns. In one or more of the foregoing or following embodiments, the wiring patterns are made of Cu or a Cu alloy in which a majority is Cu, and the pad electrodes are made of Al or an Al alloy in which a majority is Al.

In accordance with another aspect of the present disclosure, a semiconductor device includes a semiconductor circuit disposed over a substrate; wiring patterns disposed on a peripheral area, wherein the wiring patterns are embedded in a first interlayer dielectric (ILD) layer, and disposed over and electrically coupled to the semiconductor circuit; a second ILD layer disposed over the wiring patterns; pad electrodes disposed on the peripheral area and disposed over and connected to the wiring patterns, respectively; and a passivation layer disposed over the pad electrodes. The wiring patterns comprise a 2×N matrix, and the pad electrodes comprises a 2×N matrix, where N is a natural number of 4 or more, and a center of the second matrix is laterally shifted by a shift amount more than 0.1 µm with respect to a center of the first matrix toward outside the peripheral area or inside the peripheral area in plan view. In one or more of the foregoing or following embodiments, the peripheral area has a frame shape. In one or more of the foregoing or following embodiments, the shift amount is more than S/2+0.1 µm, where S is a space between adjacent wiring patterns.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
forming lower conductive patterns comprising a first column of patterns in which a plurality of conductive patterns are aligned in a first direction and a second column of patterns in which a plurality of conductive patterns are aligned in the first direction, the first column and the second column being adjacent to each other in a second direction crossing the first direction;
forming upper conductive patterns comprising a third column of patterns in which a plurality of conductive patterns are aligned in the first direction and a fourth column of patterns in which a plurality of conductive patterns are aligned in the first direction, the third column and the fourth column being adjacent to each other in the second direction, wherein:
the first column and the third column at least partially overlap with each other in plan view,
the second column and the fourth column at least partially overlap with each other in plan view,
the upper conductive patterns are formed such that a first center line extending in the first direction of the first and second columns is shifted in the second direction by a shift amount more than 0.1 µm from a second center line extending in the first direction of the third and fourth columns, and
a space between the first column and the second column is smaller than a space between the third column and the fourth column; and
forming an insulating layer over the upper conductive patterns,
wherein the insulating layer comprises peaks over the third column and the fourth column, and a valley between the third column and the fourth column,
the valley overlaps the second column in plan view, and
the insulating layer comprises a crack from the valley to at least a topmost surface of the plurality of the lower conductive patterns.

2. The method of claim 1, wherein the second center line overlaps the second column in plan view.

3. The method of claim 1, wherein:
the forming upper conductive patterns comprises forming a resist pattern corresponding to the upper conductive patterns by a lithography apparatus, and
in a lithography operation, an overlay shift other than zero in the second direction is input to the lithography apparatus so that the first center line extending in the direction of the first and second columns is shifted in the second direction from the second center line extending in the direction of the third and fourth columns.

4. The method of claim 1, wherein the shift amount is greater than a half of the space between the first column and the second column.

5. The method of claim 4, wherein:
the space between the first column and the second column is in a range from 0.8 µm to 1.2 µm,
the space between the third column and the fourth column is in a range from 1.6 µm to 2.4 µm, and
the shift amount is in a range from 0.8 µm to 1.0 µm.

6. The method of claim 1, wherein a total length of the first column is more than 200 µm.

7. The method of claim 1, wherein each of the plurality of conductive patterns in the first and second columns has a square shape with rounded corners.

8. The method of claim 7, wherein each of the plurality of conductive patterns in the third and fourth columns has a square shape with rounded corners in plan view.

9. A method of fabricating a semiconductor device, comprising:
forming a plurality of first conductive patterns arranged in a first direction and embedded in a first dielectric layer and a plurality of second conductive patterns arranged in the first direction and embedded in the first dielectric layer, wherein the second conductive patterns are spaced-apart from the first conductive patterns along a second direction crossing the first direction, and the first conductive patterns are aligned along the first direction and the second conductive patterns are aligned along the first direction;

forming a second dielectric layer over the plurality of first conductive patterns and the first dielectric layer;

forming a plurality of openings in the second dielectric layer each over a corresponding one of the plurality of first and second conductive patterns by a first patterning operation;

forming a blanket layer of a conductive material over the second dielectric layer and in the plurality of openings;

patterning the blanket layer of the conductive material to form a plurality of third and fourth conductive patterns connected to a corresponding one of the plurality of first and second conductive patterns by a second patterning operation; and forming a third dielectric layer over the plurality of third and fourth conductive patterns, wherein in the first patterning operation, the plurality of openings as a whole are shifted in the first direction by a shift amount more than 0.1 µm from the plurality of first and second conductive patterns as a whole in plan view, wherein a space between the first conductive patterns and the second conductive patterns along the second direction is smaller than a space between the third conductive patterns and the fourth conductive patterns along the second direction, wherein a thickness of the plurality of first conductive patterns is greater than a thickness of the plurality of third conductive pattern above the second dielectric layer, the thickness of the plurality of first conductive patterns is in a range from 3 µm to 5 µm, the thickness of the plurality of third conductive patterns above the second dielectric layer is in a range from 1.0 µm to 3.0 µm, wherein a center line between the plurality of third conductive patterns and fourth conductive patterns extending in the first direction overlaps the plurality of first or second conductive patterns in plan view, and a center line between adjacent third conductive patterns and adjacent fourth conductive patterns extending in the second direction overlaps first and second conductive patterns in plan view.

10. The method of claim 9, wherein a center line of adjacent two of the plurality of first conductive patterns in the first direction is shifted in the first direction by the shift amount from a center line of adjacent two of the plurality of third conductive patterns in the first direction in plan view.

11. The method of claim 9, wherein a top size of each of the plurality of openings is smaller than a largest width of each of the plurality of second conductive patterns.

12. A method of fabricating a semiconductor device having patterns, wherein the patterns include conductive patterns and island patterns, comprising:

forming lower conductive patterns arranged in a column-row matrix over a substrate, a first space between adjacent rows of the lower conductive patterns being in a range from 0.8 µm to 1.2 µm;

forming a first dielectric layer over the lower conductive patterns;

forming upper conductive patterns over the lower conductive patterns, the upper conductive patterns being arranged in a column-row matrix, a second space between adjacent rows of the upper conductive patterns being greater than the first space;

forming a first island pattern at a same level as the lower conductive patterns spaced apart from a closest pattern at the same level as the lower conductive patterns by a distance two to ten times greater than a pitch of the lower conductive patterns' column-row matrix;

forming a second island pattern at a same level as the upper conductive patterns spaced apart from a closest pattern at the same level as the upper conductive patterns by a distance two to ten times greater than a pitch of the upper conductive patterns' column-row matrix; and forming a passivation layer over the first island pattern and the second island pattern, wherein:

a center line of adjacent rows of the lower conductive patterns is shifted in a row direction by a shift amount more than 0.1 µm from a center line of adjacent two rows of the upper conductive patterns, and a center of the first island pattern is aligned with a center of the second island pattern along a direction extending away from the substrate.

13. The method of claim 9, wherein each of the first and second conductive patterns has a square shape with rounded corners in plan view.

14. The method of claim 9, wherein each of the third and fourth conductive patterns has a square shape with rounded corners in plan view.

15. The method of claim 12, wherein a center line between adjacent columns in the upper conductive patterns overlaps a column in the lower conductive patterns in plan view.

16. The method of claim 12, wherein the shift amount is greater than a half of the space between the adjacent rows.

17. The method of claim 12, wherein:

the second space between the adjacent rows in the upper conductive patterns is in a range from 1.6 µm to 2.4 µm.

18. The method of claim 17, wherein the shift amount is in a range from 0.8 µm to 1.0 µm.

19. The method of claim 12, wherein each of the lower conductive patterns has a square shape with rounded corners.

20. The method of claim 19, wherein each of the upper conductive patterns has a square shape with rounded corners in plan view.

* * * * *